(12) United States Patent
Wolodkin

(10) Patent No.: US 7,680,637 B1
(45) Date of Patent: Mar. 16, 2010

(54) AUTOMATED LINEARIZATION ANALYSIS

(75) Inventor: Greg Wolodkin, Sutton, MA (US)

(73) Assignee: The MathWorks, Inc., Natick, MA (US)

( * ) Notice: Subject to any disclaimer, the term of this patent is extended or adjusted under 35 U.S.C. 154(b) by 976 days.

(21) Appl. No.: 10/414,645

(22) Filed: Apr. 16, 2003

(51) Int. Cl.
*G06G 7/48* (2006.01)
(52) U.S. Cl. .......................................... 703/6
(58) Field of Classification Search ................ 703/6
See application file for complete search history.

(56) References Cited

OTHER PUBLICATIONS

Tsividis "Externally Linear, Time-invariant Systems and their Application to Companding Signal Processors". IEEE 1997.*
Control System Toolbox. MATLAB. Version 5. Jun. 2001.*
"First Order System: Linearizing System Equation" RDM 2000.*
"TERTS, a generic real time gas turbine simulation environment." Visser et al. National Aerospace Laboratory NLR. Feb. 2002.*

* cited by examiner

*Primary Examiner*—Kamini Shah
*Assistant Examiner*—Saif Alhija
(74) *Attorney, Agent, or Firm*—Lahive & Cockfield, LLP; Kevin J. Canning

(57) ABSTRACT

A method and apparatus automatically determines equilibrium operating conditions of a system model. The automated method enables users of block diagram models of dynamic systems to utilize simulation to define operating conditions for linearization. The automated method further allows users to generate operating conditions during simulation instead of explicitly specifying them by hand or using trim analysis. In accordance with one example, the method of generating a linear time invariant model includes providing a system model. A user specifies at least one event at which a linearization analysis should be performed. A simulation of the system model is executed. The electronic device automatically performs the linearization analysis upon occurrence of the at least one event as the simulation is running. Output results are generated of the linearization analysis to form the linear time invariant model.

70 Claims, 25 Drawing Sheets

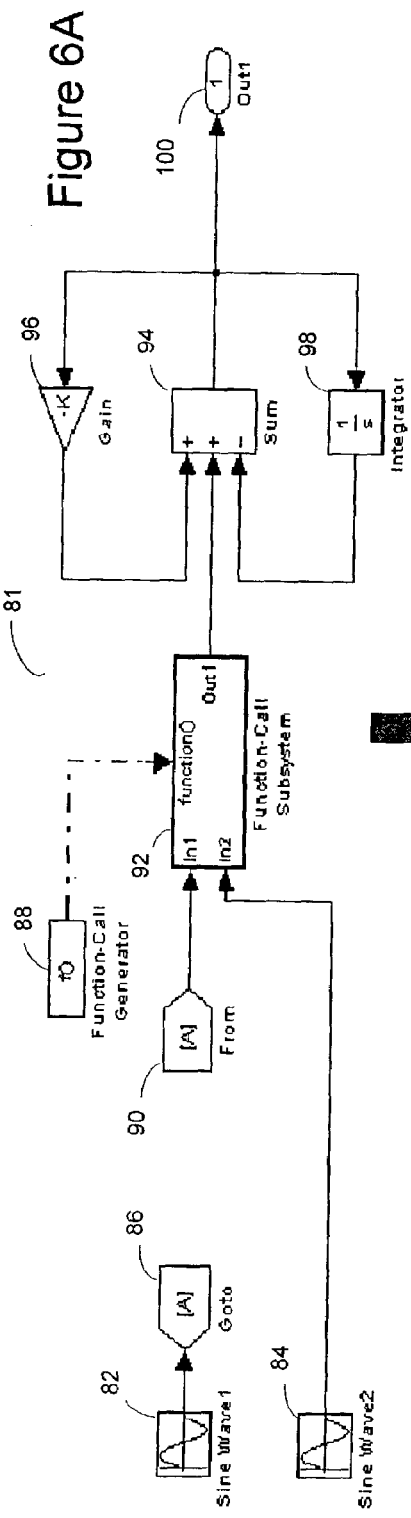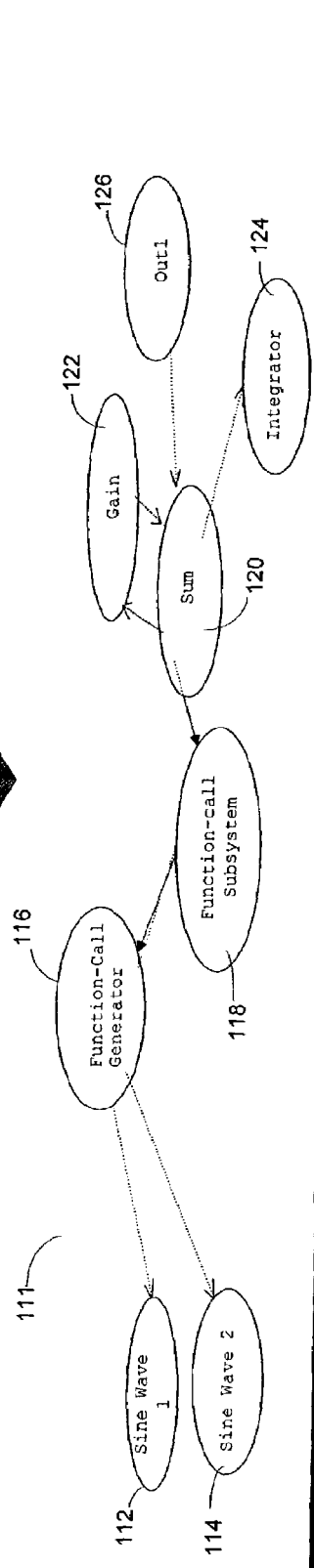

Figure 11B
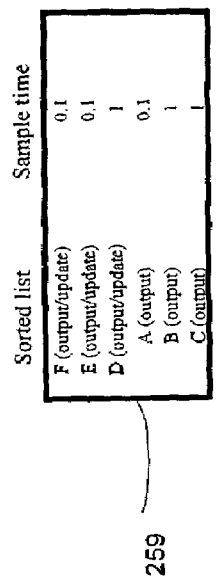
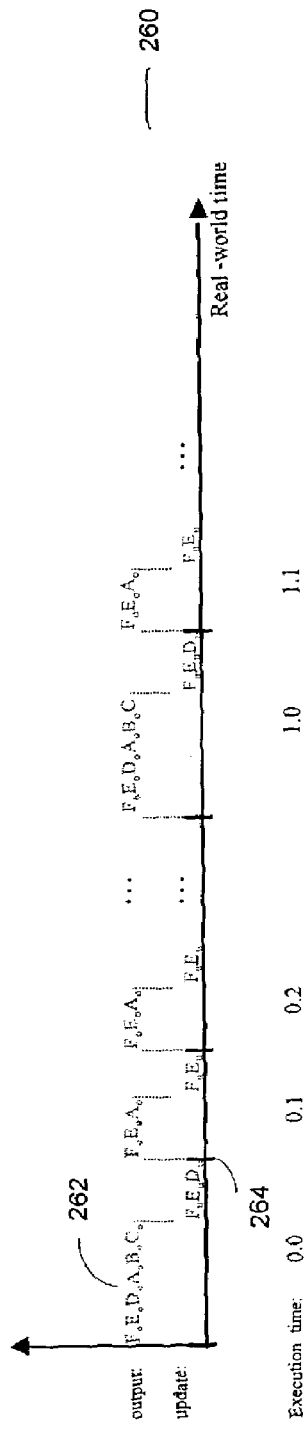
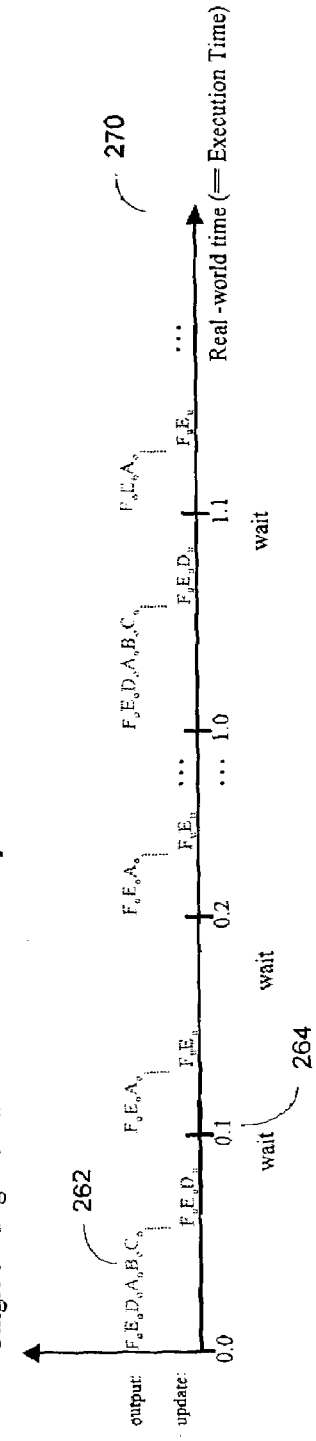

AUTOMATED LINEARIZATION ANALYSIS

FIELD OF THE INVENTION

The present invention relates to computer-automated analysis, and more particularly to the provision of an automated linearization analysis of a dynamic system

BACKGROUND OF THE INVENTION

Various classes of block diagrams describe computations that can be performed on application specific computational hardware, such as a computer, microcontroller, FPGA, and custom hardware. Classes of such block diagrams include time-based block diagrams such as those found within Simulink® from the MathWorks, Inc. Natick Ma, state-based and flow diagrams such as those found within Stateflow® from the MathWorks, Inc. Natick Ma., and data-flow diagrams. A common characteristic among these various forms of block diagrams is that they define semantics on how to execute the diagram.

Historically, engineers and scientists have utilized time-based block diagram models in numerous scientific areas such as Feedback Control Theory and Signal Processing to study, design, debug, and refine dynamic systems. Dynamic systems, which are characterized by the fact that their behaviors change over time, are representative of many real-world systems. Time-based block diagram modeling has become particularly attractive over the last few years with the advent of software packages such as Simulink® from The MathWorks, Inc. of Natick, Mass. Such packages provide sophisticated software platforms with a rich suite of support tools that makes the analysis and design of dynamic systems efficient, methodical, and cost-effective.

A dynamic system (either natural or man-made) is a system whose response at any given time is a function of its input stimuli, its current state, and the current time. Such systems range from simple to highly complex systems. Physical dynamic systems include a falling body, the rotation of the earth, bio-mechanical systems (muscles, joints, etc.), bio-chemical systems (gene expression, protein pathways), weather and climate pattern systems, etc. Examples of man-made or engineered dynamic systems include: a bouncing ball, a spring with a mass tied on an end, automobiles, airplanes, control systems in major appliances, communication networks, audio signal processing, nuclear reactors, a stock market, etc. Professionals from diverse areas such as engineering, science, education, and economics build mathematical models of dynamic systems in order to better understand system behavior as it changes with the progression of time. The mathematical models aid in building "better" systems, where "better" may be defined in terms of a variety of performance measures such as quality, time-to-market, cost, speed, size, power consumption, robustness, etc. The mathematical models also aid in analyzing, debugging and repairing existing systems (be it the human body or the anti-lock braking system in a car). The models may also serve an educational purpose of educating others on the basic principles governing physical systems. The models and results are often used as a scientific communication medium between humans. The term "model-based design" is used to refer to the use of block diagram models in the development, analysis, and validation of dynamic systems.

Block diagrams are a set of graphical connections between blocks to model the above-described dynamic systems. The individual blocks in a block diagram represent mathematical operations and output a result.

The operating conditions of a physical model define its total "state" at any given time. For example, for a model of a car engine, the operating conditions are typically described by variables such as engine speed, throttle angle, engine temperature, and the surrounding atmospheric condition. The behavior or what it typically known as the "dynamics" of the model are generally affected by the levels of the operating conditions. For example in a car, the behavior of an engine can greatly vary if the car is being operated in the high elevations of Colorado or the low elevations of Florida.

A trim or equilibrium operating condition is a special type of operating condition. A basic description of trim or equilibrium operating conditions is that, over time, the operating condition remains steady and constant. An example of a physical system at an equilibrium condition would be a car using its cruise control on a flat road. After a short period of time, the car will throttle up to a desired speed and continue down the road at this speed without deviating. When the same car is traveling up and down a mountainous road, and the cruise control cannot maintain a constant speed. This would be an example of a physical system not at an equilibrium condition. In such a case, the speed and the fuel consumption rates of the car continuously vary.

The process of linearization is the approximation of complex physical models (i.e., non-linear models) that yields a sufficiently simple linear model for engineering analysis tools. Linearization is a well-known commonly used analysis tool that has been documented in many control textbooks. A fundamental principle of linearization analysis is that the approximation of a complex physical model is accurate for regions near a baseline, equilibrium, or operating condition.

In Simulink® and other block diagram simulation applications and tools there are two conventional approaches to specifying equilibrium conditions of a physical model. The first approach involves the user employing their intuitive knowledge about the system to pick an equilibrium condition. This can be a very time consuming and difficult process due to the large number of operating conditions that must be specified in a complex physical model. The second approach involves the user employing a method known as trim analysis. The approach is to use optimization to solve for a set of operating conditions that satisfy the equilibrium conditions. The definition of an equilibrium position of a physical system modeled using the form of equation (h) shown later herein is described as:

$$\dot{x}(t) = f(x(t), x_1(k_1), \ldots, x_m(k_m), u(t)) = 0 \qquad (a)$$
$$x_1(k_1 + 1) = f_1(x(t), x_1(k_1), \ldots, x_m(k_m), u(t)) = x_1(k_1)$$
$$\vdots \qquad \vdots \qquad \vdots$$
$$x_m(k_m + 1) = f_i(x(t), x_1(k_1), \ldots, x_m(k_m), u(t)) = x_m(k_m)$$
$$y(t) = g(x(t), x_1(k_1), \ldots, x_m(k_m), u(t)) = y_c.$$

Equation (a) describes an operating condition where:
  The continuous derivatives, $\dot{x}(t)$, are zero
  The discrete states when updated remain the same ($x_i(k_i+1)=x_i(k_i)$)
  The output of the model y(t) is equal to a user defined level $y_c$ Trim analysis works well for small models, but for large models, initial guesses of the values $x(t), x_1(k_1), \ldots, x_i(k_i)$ and u(t) must be chosen very close to an equilibrium operating condition. Choosing initial values can be a problem in complex models since there are a large number of unknown variables that must be specified.

In addition, in other simulation programs, such as SystemBuild™ offered by National Instruments Corporation of Austin, Tex., users have the ability to simulate a model to a single final operating point and then linearize via the command line. To execute such a function, a user can enter a series of commands as follows. The first is to simulate a model to a final time specified by t. The external inputs to the model are specified by u.

>>y=sim(model,t,u);

The next step is to linearize the model. The {resume} argument tells the linearization to use the last operating condition. The variable "sys" is the linear model that is returned.

>>sys=lin(model,{resume});

However, this feature does not allow users to automate the process of linearization at multiple event based operating conditions during simulation. Instead, linearization is based the final operating condition after a simulation is completed.

SUMMARY OF THE INVENTION

A method for automatically determining equilibrium operating conditions of a system model during simulation is needed. A tool that enables users of block diagram models of dynamic systems, such as Simulink®, to utilize simulation to define operating conditions for linearization is also needed. The tool must allow users to generate operating conditions during simulation instead of explicitly specifying them by hand or using trim analysis. The present invention is directed toward further solutions to address these needs.

In accordance with one aspect of the present invention, in an electronic device, a method of generating a linear time invariant model includes providing a system model. A user specifies at least one event at which a linearization analysis should be performed. A simulation of the system model is executed. The electronic device automatically performs the linearization analysis upon occurrence of the at least one event as the simulation is running. Output results are generated of the linearization analysis to form the linear time invariant model.

In accordance with certain aspects of the present invention, the system model is represented by a block diagram simulation of a dynamic system. The dynamic system can be defined by at least one of a discrete, continuous, and hybrid equation. The method can further include inserting a linearization block into the block diagram. The method can also include connecting the linearization block with any signal inside the block diagram.

In accordance with other aspects of the present invention, the system model represents a control system. The at least one event includes a time based event and/or a condition based event. The condition includes at least one of a rising condition wherein a measured value increases, a falling condition wherein a measured value decreases, and a function call condition wherein an indication of a call being made to a function occurs. The condition can also include the system settling within specified parameters, at which point the linearization analysis is executed.

In accordance with other aspects of the present invention, a plurality of events at which a linearization analysis should be performed are specified so that the linearization analysis is performed multiple times. Prior to specifying the at least one event, the method can further include running the simulation of the system model to acquire an indication of likely equilibrium points upon which the at least one event can be specified.

In accordance with other aspects of the present invention, the method further includes providing a utility for launching a linearization analysis tool. Prior to specifying the at least one event, the user can select the block diagram functionality to launch the linearization analysis tool. A command module can be provided to which the output results are forwarded. A graphical user interface can alternatively be provided to which the output results are forwarded for representation to a user.

In accordance with one embodiment of the present invention, a medium holding computer executable steps for executing a method of generating a linear time invariant model is provided. The method held on the medium includes providing a system model. A user can specify at least one event at which a linearization analysis should be performed. A simulation of the system model is then run. An electronic device automatically performs the linearization analysis upon occurrence of the at least one event as the simulation is running. Output results are generated of the linearization analysis to form the linear time invariant model.

In accordance with another embodiment of the present invention, a system for generating a linear time invariant model based on a system model is provided. The system includes an event mechanism for storing at least one event at which a linearization analysis should be performed. A linearization analysis function for automatically performing the linearization analysis at the at least one event as the simulation is running is also provided. The system further includes an output mechanism for generating output results of the linearization analysis to form the linear time invariant model.

In accordance with another embodiment of the present invention, in an electronic device, a method of generating a linear time invariant model includes providing a system model. A user specifies at least one time based event and at least one non-temporal condition based event at which a linearization analysis should be performed. A simulation of the system model is executed. The electronic device automatically performs the linearization analysis upon occurrence of the at least one time based event and the at least one non-temporal condition based event as the simulation is running. Output results are generated of the linearization analysis to form the linear time invariant model.

In accordance with another embodiment of the present invention, in an electronic device, a method of generating a linear time invariant model includes a user developing a block diagram model of a system for simulation. The user specifies linearization conditions for reconfiguration of the system and then activates the simulation. At least one linearization event occurs and at least one linearization analysis is performed at the at least one linearization event. The electronic device outputs a result of the at least one linearization analysis. The system is then reconfigured based on the result to meet performance requirements provided by the user. The block diagram model of the system is subsequently updated to comply with the system after reconfiguring to derive the linear time invariant model.

BRIEF DESCRIPTION OF THE DRAWINGS

The present invention will become better understood with reference to the following description and accompanying drawings, wherein:

FIG. 6A depicts a block diagram and its associated directed graph;

FIG. 6B depicts a linear sorted list generated from the directed graph of FIG. 6A;

FIG. 11B depicts the execution timing of block diagrams in single task mode in timelines synchronized and non-synchronized with real world time;

DETAILED DESCRIPTION

Figure 1:
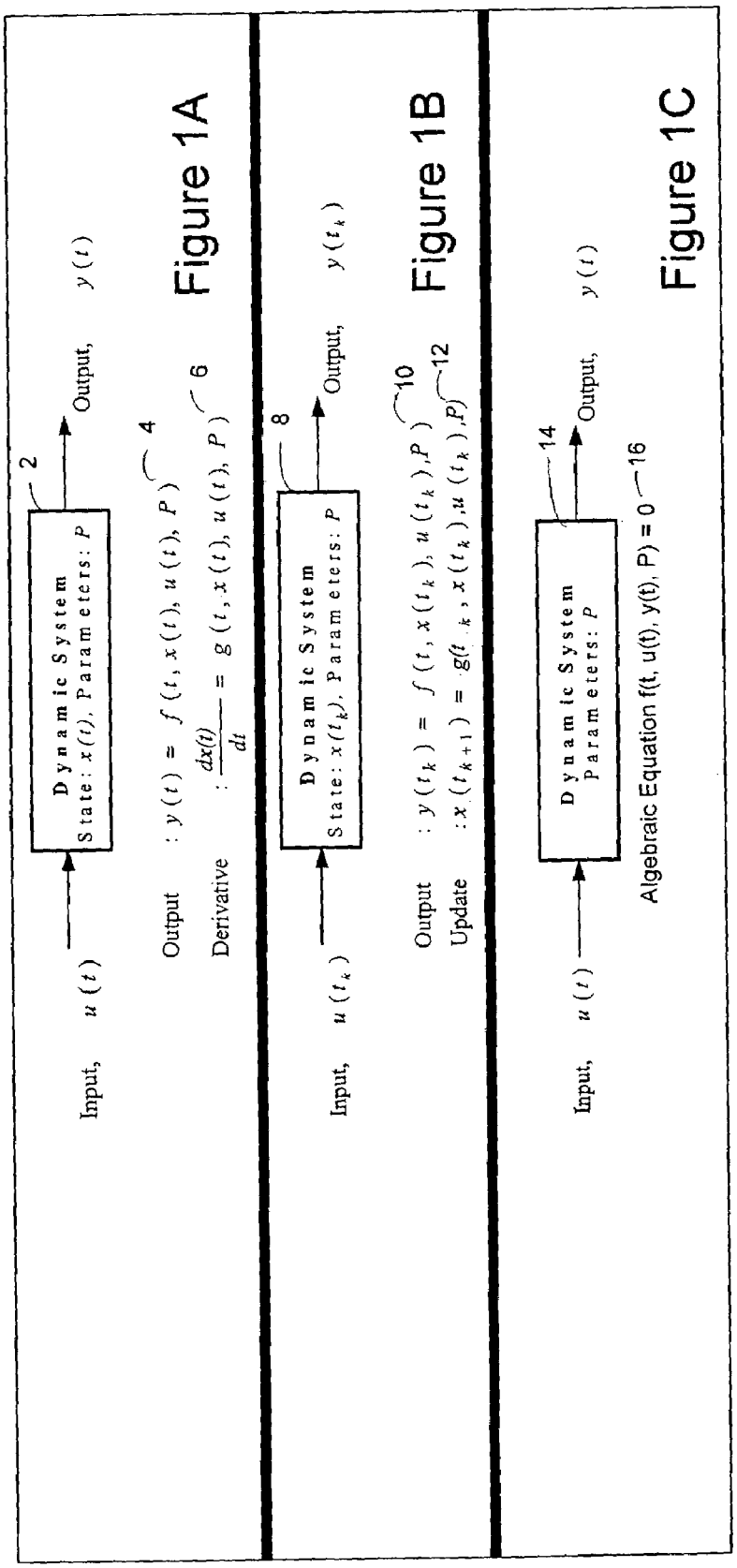
FIG. 1A depicts a dynamic system described with ordinary differential equations (ODE)
FIG. 1B depicts a dynamic system described with difference equations.
FIG. 1C depicts a dynamic system described with algebraic equations.

An illustrative embodiment of the present invention relates to an automated method that performs the linear analysis of physical models programmed in a block diagram simulation environment while in the process of simulation. Users of the invention can specify, through a graphical user interface (GUI), the specific simulation time and events when the linear analysis should occur. During a simulation, at the user specified events, the method of the present invention performs a linearization analysis of the block diagram model to determine a time invariant model and returns the results to the user for later analysis. In specifying the time and events of when the linearization analysis should occur, the user can set the analysis to execute based on time or condition events, such as a changing variable, a settling system range, a rising, falling, or rising and falling variable, or combinations of any of these parameters in addition to the use of function calls. As such, the user can define a number of different instances where the automated linearization analysis will occur in any given model.

FIGS. 1 through 26, wherein like parts are designated by like reference numerals throughout, illustrate example embodiments of an automated linearization analysis method for analyzing dynamic systems according to the present invention. Although the present invention will be described with reference to the example embodiments illustrated in the figures, it should be understood that many alternative forms can embody the present invention. One of ordinary skill in the art will additionally appreciate different ways to alter the parameters of the embodiments disclosed in a manner still in keeping with the spirit and scope of the present invention.

Description of Block Diagram Modeling

Dynamic systems are typically modeled as sets of differential, difference, and/or algebraic equations. At any given instant of time, these equations may be viewed as relationships between the system's output response ("outputs"), the system's input stimuli ("inputs") at that time, the current state of the system, the system parameters, and time. The state of the system may be thought of as a numerical representation of the dynamically changing configuration of the system. For instance, in a physical system modeling a simple pendulum, the state may be viewed as the current position and velocity of the pendulum. Similarly, a signal-processing system that filters a signal would maintain a set of previous inputs as the state. The system parameters are the numerical representation of the static (unchanging) configuration of the system and may be viewed as constant coefficients in the system's equations. For the pendulum example, a parameter is the length of pendulum and for the filter example; a parameter is the values of the filter taps.

There are four common types of mathematical models used in the study of dynamic systems. The first type of mathematical model describes systems using ordinary differential equations (ODEs) as depicted in FIG. 1A. The dynamic system 2 specifies a set of two equations: Output 4 and Derivative 6.

The Output equation 4 facilitates the computation of the system's output response at a given time instant as a function of its inputs, states, parameters, and time. The Derivative equation 6 is an ordinary differential equation that allows the computation of the derivative of the states at the current time as a function of the inputs, the states, parameters, and time. This class of models is suitable for systems in which it is important to track the system response as a continuous function of time. Such continuous-time systems are commonly representative of physical systems (mechanical, thermal, electrical). For simple systems, it may be possible to use the Output 4 and Derivative equations 6 to obtain a closed-form solution for the output response y(t). However, in most complex real world systems, the response of the system is obtained by integrating the states through numerical means.

The definition of an ODE used herein encompasses both implicit and explicit differential equations. The class of ordinary differential equations may require additional equations to define the system being modeled. For example, equations called projections may be required to impose constraints on the differential variables (e.g., states $X_1$ and $X_2$ must fall on the manifold defined by $X_1^2+X_2^2=25$). These constraints can be applied as either a secondary condition or a coupled condition to the differential equation. Although systems including the projections may conventionally no longer qualify as an ODE, they are included here to simplify the categories of systems. Another example is the use of a Jacobian equation that defines partial derivatives with respect to the independent and/or differential variables. The Jacobian equation is typically used when obtaining a linear approximation of a non-linear model or an overall linear model of a set of equations. Jacobian equations are required for some forms of numerical integration, for producing the linear model once the model has reached its steady state operating point, etc. The Output 4 and Derivatives equations 6 may be extended to define other relationships for the block. For example, the Output equation 4 may help manage its states by defining a relationship where it resets the state back to a known quantity at a specific point in time or when a specific condition is seen.

Another type of mathematical model describes systems using difference equations as depicted in FIG. 1B. The dynamic system 8 specifies a set of two equations: Output 10 and Update 12. The Output equation 10 facilitates the computation of the system's output response at a given time instant as a function of the inputs, states at some previous time, parameters, and time. The Update equation 12 is a difference equation that allows the computation of the states at the current time as a function of the inputs, states at some previous time, parameters, and time. This class of models is suitable for systems in which it is important to track the system response at discrete points in time. Such discrete-time systems are commonly representative of discrete-time control and digital signal processing systems. For simple systems, it may be possible to use the Output 10 and Update equations 12 to obtain a closed-form solution for the output response y(t). But in most complex real world systems, the response of the system is solved through recursion. The Output 10 and Update equations 12 are applied repeatedly to solve for the system response over a period of time.

An additional type of mathematical model describes systems using algebraic equations as depicted in FIG. 1C. The dynamic system 14 uses an algebraic equation 16 that needs to be solved at each time to obtain the outputs. While simple systems may allow one to obtain a closed-form solution for the system inputs and outputs, practical algebraic equations may best be solved iteratively using a numerical method involving both perturbations and iterations. Algebraic equation solving techniques used in the context of dynamic system modeling are discussed in detail below.

A fourth type of mathematical model is a composite system that has components that fall into the three types of models discussed above. Most complex real-world system models fall into this category. This class of systems has Output, Derivative, Update, Algebraic, and potentially other equations. Solving for the output response of such systems requires a combination of the solution approaches discussed for all of the classes above. One example of a composite system is one described by differential-algebraic equations (DAEs) which contain both differential equations and algebraic equations.

Grouped within the composite class of systems are many extensions involving relationships (equations) defined in terms of both outputs and state. For example, one can define a limited integration relationship for a differential variable. This relationship requires a set of equations that consists of the Output equation, an Update equation, a Derivative equation, and a Zero Crossing equation. The Zero Crossing equation defines the points in time where the upper and lower limits of the limited integration occur. Another example of an extension is the notion of Enable and Disable equations that define relationships among states or signals when parts of a system are activated and deactivated during execution.

Inherent in the four classes of systems (ODE, difference equations, algebraic equations and composite) is the notion of system sample time. The sample-time is the time interval at which the inputs, state, or outputs (collectively referred to as the results) of the system are traced as time progresses. Based on sample times, a system can be described as a discrete-time system, continuous-time system and hybrid system. A discrete-time system is a system in which the evolution of the system results are tracked at finite intervals of time. In the limit as the interval approaches zero, the discrete-time system becomes a continuous-time system. The intervals of time may be periodic or non-periodic. Sometimes, non-periodic rate systems are referred to as non-uniform rate systems meaning that there is no periodic rate at which the response can be tracked Nonunifiorm-rate systems can fall into the class of composite systems where an additional equation (GetTimeOfNextVarHit) defines when in the future the other equations associated with the system should be evaluated. A continuous-time system is a system in which the evolutions of the system results are continuously changing. Continuous-time signals change during numerical integration (minor time steps). An example of a continuous-time system is one described by an ODE. There can also be algebraic or composite continuous-time systems. A hybrid system is a system with both discrete-time and continuous-time elements.

If a system has only one sample time, it is said to be single-rate. If a system has multiple sample times, it is said to be multi-rate. Multi-rate systems can be evaluated (executed) using either a single-tasking form of execution or a multi-tasking form of execution. When multi-tasking execution is used, it conforms to rate monotonic scheduling principals as defined by Liu, C. L., and LAYLAND, J. W. *Scheduling Algorithms for Multiprogramming in a Hard-Real-Time Environment*. ACM 20, 1 (January 1973), 46-61. Systems may also be categorized by the type of numerical integration solver being used. A fixed-step system is one that uses a fixed-step solver. Fixed-step solvers typically use explicit methods to compute the next continuous state at fixed periodic intervals of time. A variable-step system is one that is using a variable-step solver. A variable-step solver can use either implicit or explicit methods to compute the next continuous state at non-periodic intervals of time. Generally, variable-step solvers use a form of error control to adjust the interval size such that the desired error tolerances are achieved.

In practice, except for the most basic systems, mathematical models for dynamic systems involve a complex set of mathematical transformations applied in some prescribed manner with the outputs of some transformations forming the inputs of others. Each elemental transformation may be viewed in isolation as a simple dynamic system falling into one of the categories listed above. Therefore, a complex dynamic system may be modeled as an interconnection of various simple dynamic systems. A schematic representation of such an interconnection that has evolved over the years is the block diagram. Such block diagram models have now become a standard means in textbooks, design papers, journal articles, and specifications to communicate the details of a dynamic system's behavior.

Figure 2:
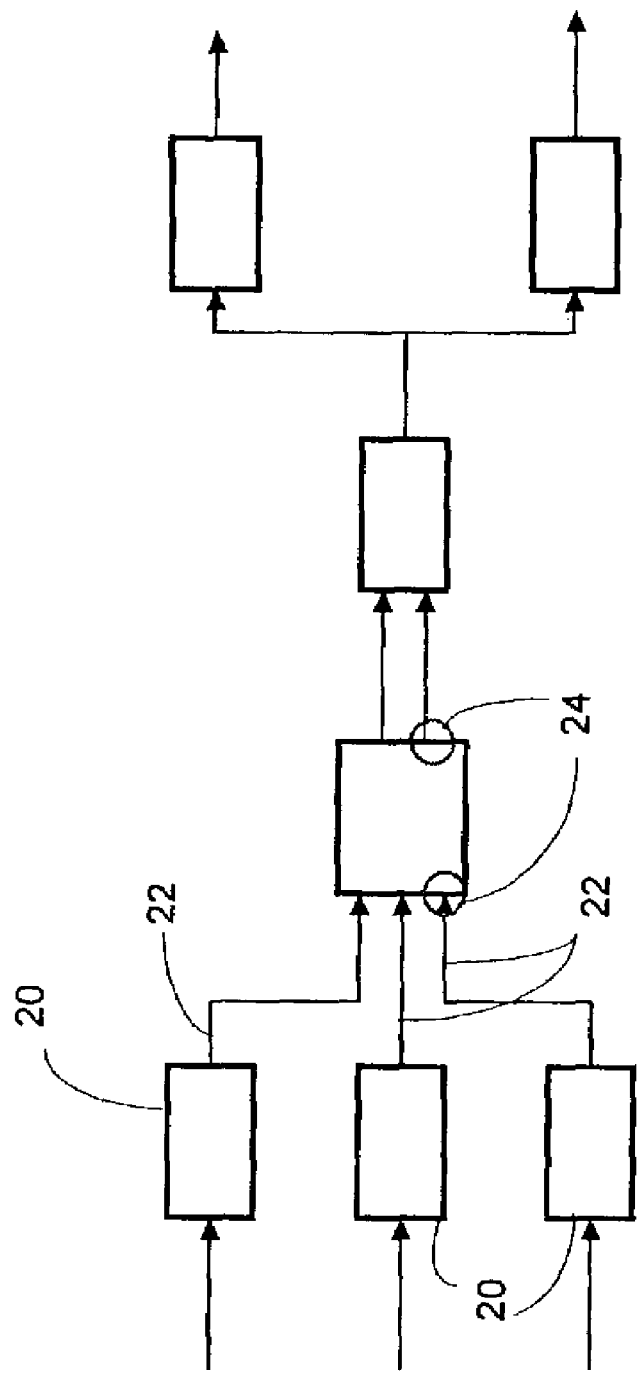
FIG. 2 depicts components of a basic block diagram.

A block diagram model of a dynamic system is represented schematically as a collection of blocks interconnected by lines that represent signals. A signal represents the input and output of a dynamic system. Each block represents an elemental dynamic system. A line emanating at one block and terminating at another signifies that the output of the first block is an input to the second block. Each distinct input or output on a block is referred to as a port. Signals correspond to the time-varying quantities represented by each line connection and are assumed to have values at each time instant. The source block of a signal writes to the signal at a given time instant when its system equations are solved. The destination blocks of this signal read from the signal when their system equations are being solved. The basic components of a block diagram are illustrated in FIG. 2. The block diagram includes a plurality of blocks 20, lines 22, and ports 24 that are interconnected. Those skilled in the art will recognize that the term "blocks" does not refer exclusively to elemental dynamic systems but may also include other modeling elements that aid in readability and modularity of block diagrams.

The theory of Digital Signal Processing (DSP) focuses on modeling signals as sequences of samples. This view naturally fits into the time-based block diagram paradigm by mapping the samples u[n] to discrete-time points $u(t_k)$. This adds the benefit of being able to model the interaction between DSP systems and other classes of time-based systems, e.g. continuous and/or discrete-time control systems.

Put another way, block diagram models are time-based relationships between signals and state variables representative of a dynamic system. The solution (computation of system response) of the model is obtained by evaluating these relationships over time, where time starts at a user-specified "start time" and ends at a user-specified "stop time". Each evaluation of these relationships is referred to as a time step. Signals represent quantities that change over time, and these quantities are defined for all points in time between the block diagram's start and stop time. The relationships between signals and state variables are defined by sets of equations represented by blocks. These equations define a relationship between the input signals, output signals, state, and time. Inherent in the definition is the notion of parameters, which are the coefficients of the equations.

It is important to note that block diagrams are not exclusively used for representing time-based dynamic systems but also for other models of computation. For instance, flowcharts are block diagrams used to capture process flow and are not generally suitable for describing dynamic system behavior. Data flow block diagrams are block diagrams that describe a graphical programming paradigm where the availability of data (often thought of as tokens) is used to initiate the execution of blocks, where a block represents an operation and a line represents execution describing the direction of dependency data flowing between blocks. As used herein, the term block diagrams means time-based block diagrams used in the context of dynamic systems except as otherwise noted.

Block diagram modeling has spawned a variety of software products such as Simulink® from The Mathworks, Inc. of Natick, Massachusetts, that cater to various aspects of dynamic system analysis and design. Such products allow users to perform various types of tasks including constructing system models through a user-interface that allows drafting block diagram models, allowing augmentation of a pre-defined set of blocks with custom user-specified blocks, the use of the block diagram model to compute and trace the temporal evolution of the dynamic system's outputs ("executing" the block diagram), and automatically producing either deployable software systems or descriptions of hardware systems that mimic the behavior of either the entire model or portions of it (referred to herein as "code generation"). Each of the tasks listed above has many intricate details and subtle variations, which are explored further below.

Block modeling software includes a number of generic components. Although the discussion contained herein focuses on Simulink® version 5.0 (Release 13) from the MathWorks, Inc. of, Natick Mass., those skilled in the art will recognize that it is applicable to other block modeling software applications. The generic components include a block diagram editor, blocks and a block diagram execution engine. The block diagram editor allows users to perform such actions as draw, edit, annotate, save, and print out block diagram representations of dynamic systems. As noted earlier, blocks are the fundamental mathematical elements of a classic block diagram model. Simulink® extends the classic block diagram models by introducing the notion of two classes of blocks, non-virtual blocks and virtual blocks. Non-virtual blocks are elementary dynamic systems. A virtual block is provided for graphical organizational convenience and plays no role in the definition of the system of equations described by the block diagram model. Examples of virtual blocks are the Bus Creator virtual block and Bus Selector virtual block which are used to reduce block diagram clutter by managing groups of signals as a "bundle". Virtual blocks may be used to improve the readability of models. Simulink® further extends the meaning of a non-virtual block to include other semantics, such as a "merge" block semantic. The merge block semantic is such that on a given time step its output is equal to the last block to write to an input of the merge block. An additional extension provided by Simulink® is the concept of conditional execution. Simulink® contains the concept of conditional and iterative subsystems that control when in time block methods execute for a sub-section of the overall block diagram.

A block diagram execution engine contributes to the modeling software task of enabling the computation and tracing of a dynamic system's outputs from its block diagram model. An execution engine carries out the task of compiling and linking the block diagram to produce an "in-memory executable" version of the model that is used for generating code and/or simulating or linearizing a block diagram model. Note that execution of the block-diagram is also referred to as simulation. The compile stage involves checking the integrity and validity of the block interconnections in the block diagram. In this stage, the engine also sorts the blocks in the block diagram into hierarchical lists that are used when creating the block method execution lists. In the link stage, the execution engine uses the result of the compiled stage to allocate memory needed for the execution of the various components of the block diagram. The linking stage also produces block method execution lists that are used by the simulation or linearization of the block diagram. Included within the link stage is the initialization of the model, which consists of evaluating "setup" methods (e.g. block start, initialize, enable, and constant output methods). The block method execution lists are generated because the simulation and/or linearization of a model must execute block methods by type (not by block) when they have a sample hit.

After linking has been performed, the execution engine may generate code. In this stage, the execution engine may choose to translate the block diagram model (or portions of it) into either software modules or hardware descriptions (broadly termed code). If this stage is performed, then the stages that follow use the generated code during the execution of the block diagram. If this stage is skipped completely, then the execution engine uses an interpretive mode of execution for the block diagram. In some cases, the user may not proceed further with the execution of the block diagram because they would like to deploy the code outside the confines of the block diagram software. Upon reaching the simulation stage, the execution engine uses a simulation loop to execute block methods in a pre-defined ordering upon a sample hit to produce the system responses they change with time.

For linearization, Simulink® uses the block method execution lists in a prescribed fashion to produce a linear state space representation of the dynamic system described by the block diagram.

The block diagram editor is the graphical user interface (GUI) component that allows drafting of block diagram models by a user. In Simulink®, there is also a textual interface with a set of commands that allow interaction with the graphical editor. Using this textual interface, users may write special scripts that perform automatic editing operations on the block diagram. A user generally interacts with a set of windows that act as canvases for the model. There is generally more than one window for a model because models may be partitioned into multiple hierarchical levels using subsystems (discussed further below).

A suite of GUI tools in Simulink® allows users to draft a block diagram model on the corresponding windows. The GUI tools include a block palette, wiring line connection tool, annotation tool, formatting tool, attribute editing tool, save/load tool and publishing tool. The block palette is a library of all the pre-defined blocks available to the user when they are building the block diagram. Individual users may be able to customize this palette to: (a) reorganize blocks in some custom format, (b) delete blocks they do not use, and (c) add custom blocks they have designed. The palette allows blocks to be dragged through some human-machine interface (such as a mouse or keyboard) from the palette on to the window (i.e., model canvas). The graphical version of the block that is rendered on the canvas is called the icon for the block. There may be different embodiments for the block palette including a tree-based browser view of all of the blocks.

The wiring line connection tool allows users to draw directed lines that connect the ports of blocks in the model's window. Lines are also added through various mechanisms involving human-machine interfaces such as the mouse or keyboard. Simulink® also provides various forms of auto-connection tools that connect blocks automatically on user request to produce an aesthetically pleasing layout of the block diagram (especially those with high complexity with large numbers of blocks). The annotation tool allows users to add notes and annotations to various parts of the palette for a block diagram. The formatting tool enables users to perform various formatting operations that are generally available on any document editing tool. These operations help pick and modify the various graphical attributes of the block diagram (and constituent blocks) such as include font-selection, alignment & justification, color selection, etc. The block diagram and all the blocks within the block diagram generally have a set of functional attributes that are relevant for the execution or code-generation. The attribute editing tool provides GUIs that allows these attributes to be specified and edited. The save/load tool allows a created block diagram model to be saved. The saved model can be reopened in the editor at some later juncture through a load mechanism. Simulink® also allows users to save blocks including pre-constructed subsystems into a separate class of block-diagrams called libraries. Such libraries facilitate reuse of the same block in a number of other block-diagrams. The load/save mechanism is specially equipped to handle loading and saving of blocks in a block-diagram that actually reside in libraries.

The publishing tool enables the viewing of the block diagram as a document that can be published in any of the standard document formats (examples: PostScript, PDF, HTML, etc.). Those skilled in the art will recognize that the windows for multiple models and all of the tools mentioned above could potentially be embedded in a single Multi-Document Interface (MDI) for providing a unified software environment. Those skilled in the art will also recognize that block-diagram packages offer scripting languages for writing out programs that automatically carry out a series of operations that would normally require interaction with the GUI. For example, Simulink® offers a set of commands in MATLAB for carrying out operations such as block addition (add_block), block deletion (delete_block), starting and terminating execution (set_param), modifying block attributes (set_param/get param), etc.

Simulink® also offers a variety of other GUI tools that improve the ability of users to build and manage large block diagrams. Examples of such GUIs include: (a) a Finder that helps find various objects such as blocks and lines within a block-diagram, (b) a Debugger that helps debug the execution of block-diagrams, (c) a Revision Control UI for managing multiple revisions of the block-diagram, and (d) a Profiler for viewing timing results while executing a block-diagram.

A typical base data-structure for a block may be represented as:

```
class Block {
    public:
    // Access methods for setting/getting block data
    ...
    // Methods for block editing
    virtual ErrorStatus BlockDrawIcon( );
    virtual BlockParameterData BlockGetParameterData( );
    ...
    // Methods for block compilation
    ...
    // Methods for block execution
    ............................................
    virtual ErrorStatus BlockOutput( )=0;
    virtual ErrorStatus BlockDerivative( )=0;
    virtual ErrorStatus BlockUpdate( )=0;
    ...
    private:
    BlockGraphicalData blkGraphicalAttributes;
    BlockFunctionalData blkFunctionalAttributes;
    BlockCompiledData blkCompiledAttributes;
    BlockExecutionData blkExecutionData;
    ...
};
```

Although the example of the data structure above is written in C++, those skilled in the art will recognize that equivalent data structures written in other languages may also be used. The major data fields of the block data structure fall into four categories, a graphical attributes field, a functional attributes field, a compiled attributes field and an execution data field.

The graphical attributes field is responsible for storing information relevant for graphical rendering of the block within its parent block diagram's GUI. Attributes specific to the block icon such as font, color, name, and icon-image are stored in this field. It should be noted that modifying these attributes does not affect the dynamics of the model using this block. The functional attributes field is responsible for specifying block attributes that may potentially affect the dynamics of the model using this block. These attributes are specified for the block as a whole and the input and output ports of the block. Examples of block attributes include block sample times and restrictive flags. Block sample times specify if the block corresponds to an elemental, continuous, discrete, or hybrid dynamic system. If the block is an elemental discrete-time system, then the attribute specifies the spacing between time instants at which the block response should be traced. A restrictive flag disallows the use of blocks in certain modeling contexts. For example, one may impose the restriction that there may only be one instance of given block in a model.

Attributes of block ports specify properties of the data that is either available or produced at that port. Block port attributes include dimensions, datatypes, sample rates, and direct feedthrough. Dimension attributes are individual dimensions of a multi-dimensional matrix that is used as a container for data elements. Datatype attributes are the datatype of each element of data in the data container. A complexity attribute is a flag to specify if each data element is real or complex. A sample rate attribute specifies how when the signal corresponding to an input or output port will be used. The port sample times may sometimes be used to implicitly infer the block's sample time. The direct feedthrough attribute is specified only for input ports and indicates whether or not the Output and/or GetTimeOfNextHit equations of the block are a function of the given input. This attribute helps in determining the sequence in which block methods should be executed while executing the block diagram.

The compiled attributes field of the block data structure holds the attributes of the block and its ports that mirror the functional attributes previously listed. This field is filled in during block diagram compilation by utilizing the functional attributes of the block in conjunction with the functional and compiled attributes of the blocks that are connected to it. This process of determining the compiled attributes from the functional attributes is termed attribute propagation. Attribute propagation is described in detail below in the section on block diagram compilation. The execution data field is mainly responsible for storing the memory locations that are going to serve as sources for block inputs, outputs, states, parameters, and other work areas during execution of blocks.

The block data structure also has a set of associated methods that may be categorized as access methods to data fields, methods used in editing, methods used in compilation, and methods used in execution. Access methods to data fields help in setting and getting the various data fields of the block. Methods used in editing are called by the block diagram editor in order to render the block appropriately in the GUI of its parent block diagram. For instance, this set of methods may include a BlockDrawIcon method that determines the shape the block icon has on the GUI. Methods used in compilation are methods that are called by the block diagram compilation engine. They help validate the connections of the block to other blocks on the block diagram. The methods used in execution include a number of different run-time methods that are required for execution. These include the BlockOutput, BlockUpdate, BlockDerivative methods that realize the Output, Update, and Derivative equations discussed earlier in the context of dynamic systems. In addition, to these methods Simulink® includes several other run-time methods, such as the Jacobian, Projection, ZeroCrossings, Enable, Disable, Initialize, EvalParams (check and process parameters), and GetTimeOfNextHit methods. It should be noted that there is no explicit method for algebraic equations because these are represented and processed in a different manner, which will be discussed below.

Figure 3:
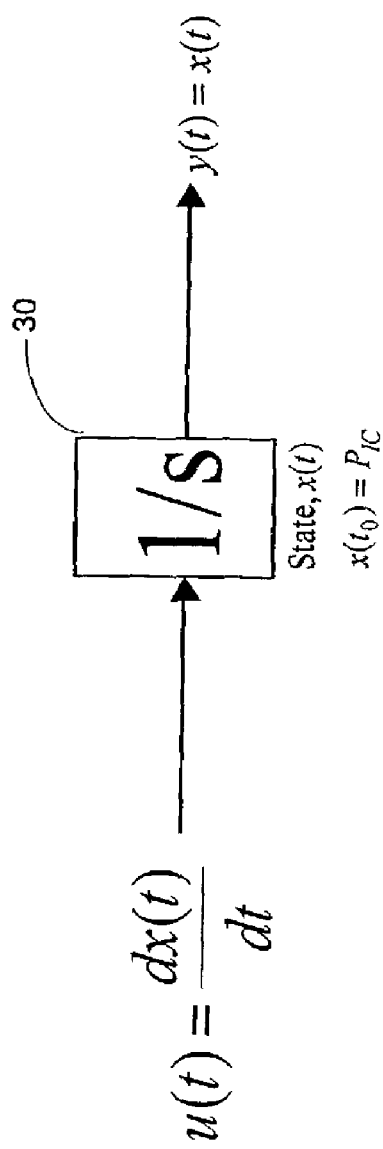
FIG. 3 depicts the desired behavior of an integrator block.
Figure 4:
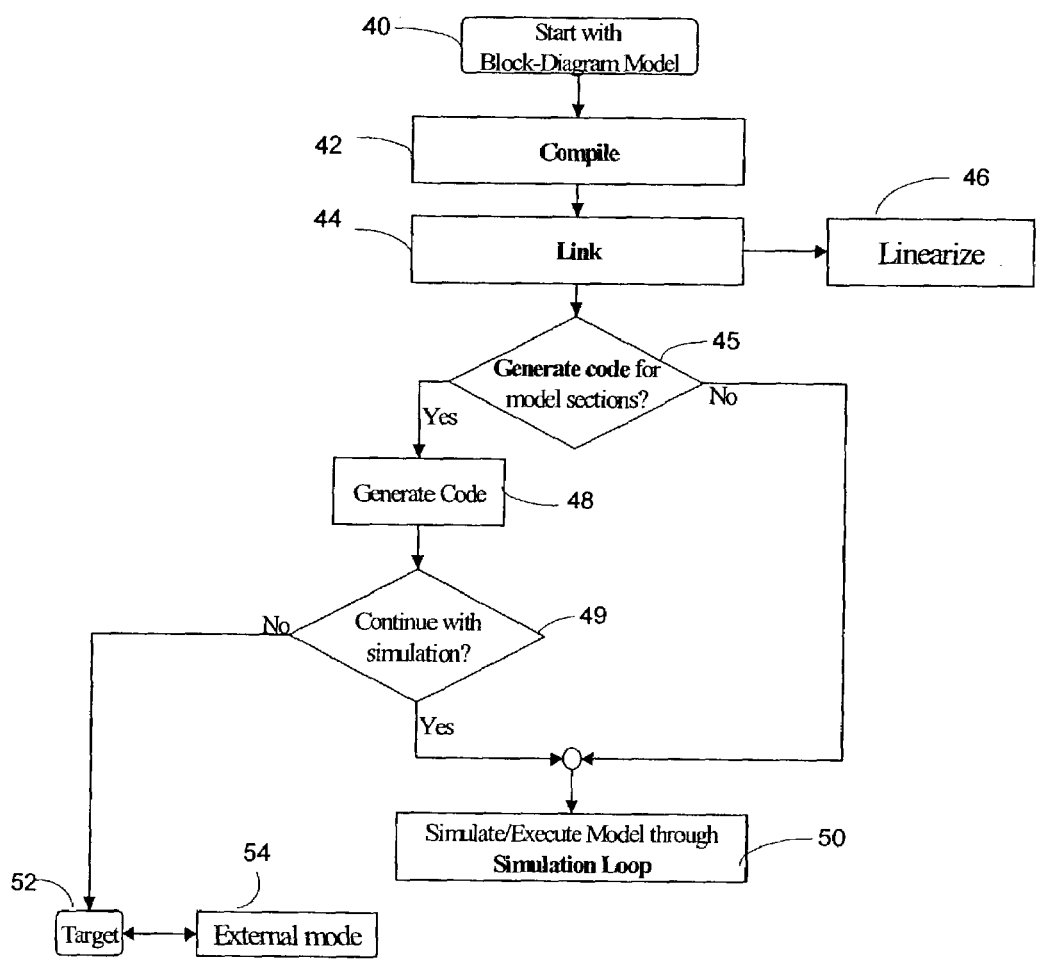
FIG. 4 is a flow chart of the sequence of steps used to perform simulation of the block diagram.

The base data structure for the block specifies the generic fields and interfaces that need to be supported by a block. Some of the methods are purely virtual and have no specific implementation in the base block class. In order to define a specific block (such as an Integrator block), one needs to subclass the base block class and provide explicit definitions for these virtual methods. An example of the subclassing of a block may be seen by examining an Integrator block. FIG. 3 depicts the desired behavior of an Integrator block 30. In order to create the subclass, four major categories of information within the subclass must be specified, the block parameters, the methods used in editing, the methods used in compilation, and the methods used in execution. The elemental dynamic system embodied by the block may be parameterized as illustrated in FIGS. 1A-1C. Each block needs to be able to specify its list of expected parameters. The block diagram editor's Attribute-Editing tool may allow users to specify the parameters for the block when they use it in their models. In the Integrator block example, the block has one parameter that specifies the block's initial condition for the block's state. Regarding the methods used in editing, the subclass needs to specify a method that renders its icon. For example, the Integrator block may implement a method that makes a box icon with a '1/s' within the box. Also, the subclass needs to instantiate a method that allows access of the block parameters from the GUI's Attribute-Editing tool. For the Integrator example, this method would allow users to specify the Initial Condition parameter on a GUI for the block. For the methods used in compilation, the subclass needs to instantiate methods that help in the compilation of the block diagram model in which it is placed. These methods help specify the compiled information for the inputs and outputs of the block. For instance, the Integrator block may specify a method that ensures that if the input to the Integrator is a vector, then the output is a vector of the same size. For methods used in execution, the subclass needs to instantiate specific Output, Derivative, and Update methods that represent the block behavior. In the case of the Integrator block, an Output and Derivative method are needed. Note that in Simulink®, the Integrator block includes additional methods not illustrated here. The Output method sets the output to be equal to the state. The Derivative method sets the derivative of the state to be equal to the input.

The specification of these four types of information for the Integrator block subclass may be shown by a reduced form of the Simulink® Integrator block:

```
IntegratorBlock : public Block {
  public:
  ErrorStatus BlockDrawIcon( ) {
    // Draw '1/s' on the icon
    .............................
  }
```

```
BlockParameterData BlockGetParameterData( ) {
    // Return initial_condition as block data}
    ..............................
}
ErrorStatus BlockOutput( ) {
    // Implement y(t)=x(t)
    ..............................
}
ErrorStatus BlockDerivative( ) {
    // Implement dx(t)/dt=u(t)
    ..............................
}
private:
double initial_condition;
};
```

It should be noted that block diagram software generally provides open access to the block's data structure to users of the software. This allows users to create and utilize custom block implementations in their models.

Blocks in a block diagram may be virtual or non-virtual. The designation of a block as non-virtual indicates that it influence the equations in the mathematical model for the dynamic system. In the context of block diagram software, it is beneficial to include other virtual blocks that do not affect the equations in the dynamic system's model. Such blocks help improve the readability and modularity of the block diagram and wield no semantic influence on the mathematical model. Examples of such virtual blocks include virtual subsystems, inport blocks and outport blocks, bus creator blocks and From and Goto blocks.

Modularity may be achieved in a block diagram by layering the block diagram through the use of subsystems. A subsystem facilitates layering by allowing a collection of blocks to be represented by a single block with input and output signals. The input and output signals of the subsystem are accessible to the constituent blocks within the subsystem. A subsystem is a virtual subsystem if its constituent blocks are moved back into the main block diagram model during the model's execution. Within a virtual subsystem graphical entities, called inport and outport blocks, are provided to define signal connections to the parent block diagram. These inport and outport blocks indicate a tunnel-through signal connection to the parent block diagram.

Additional types of virtual blocks include bus creator blocks and selector blocks. In large models, there may be an extensive set of lines that connect one section of a block diagram to another section. To avoid excessive clutter of lines and improve readability, there is typically a special block called a Bus Creator that helps bundle all of the lines together to form a single bus line. This single bus line then connects the two sections of the model. At the destination end of the line, a block called a Bus Selector helps un-bundle the individual lines so that they can be connected to other blocks.

Other virtual blocks include From blocks and Goto blocks that are special blocks that help avoid graphical clutter, e.g. a line that connects two distant sections of a block diagram. The line is terminated close to its originating point by a From block. At the other end, a new line is drawn from a Goto block that is hot-linked to the From block. Each Goto and From block has an associated tag that describes which blocks are connected together. An important point to be noted is that Virtual blocks have neither execution data nor execution methods in their data structure.

Simulink® also provides the user with the ability to extend the simulator by providing the ability to enhance the simulator with blocks that define dynamic systems or are virtual properties. The extension is provided through a language independent API (e.g. C, C++, Ada, Fortran, Assembly, M).

As noted previously, to facilitate modeling fairly large and complex dynamic systems, Simulink® allows users to layer their block diagrams. A subsystem facilitates such layering by allowing a collection of blocks to be represented by a single block with input and output signals. The input and output signals of the subsystem are accessible to its constituent blocks. By nesting subsystems within each other, one can create block diagrams with arbitrary layers of hierarchy. Ideally, a subsystem has no impact on the meaning of the block diagram. Additionally, subsystems provide a way of grouping blocks together and allowing other block diagram constructs to impose unified control on the constituent blocks. To enhance the modularity of subsystems, modeling software also allows aggregated list(s) of parameters of the blocks within the subsystem to be accessed from a single GUI, and defines and displays special icons on the subsystems. The process of defining the parameter list and the special icon is called masking a subsystem.

There are two main types of subsystem blocks, virtual subsystems, and non-virtual subsystems. Virtual subsystems serve the purpose of providing the block diagram with a graphical hierarchy. Non-virtual subsystems behave like an elemental dynamic system with its own execution methods (Output, Update, Derivatives, etc.). These execution methods in turn call the execution methods of the constituent blocks.

The classes of nonvirtual subsystems are:

Atomic subsystems. These are similar to virtual subsystems, with the advantage of grouping functional aspects of models at a given layer. This is useful in modular design. Conditionally-executed subsystems. These are non-virtual subsystems that execute only when a precondition is fulfilled.

Enabled subsystems. These are similar to Atomic subsystems, except that the constituent blocks only execute when an enable signal feeding the subsystem is greater than zero.

Triggered subsystems. These are similar to Atomic subsystems, except that the constituent blocks only execute when a rising and/or falling signal is seen on a triggering signal feeding the subsystem.

Enable with Trigger subsystems. These are an intersection of the properties of Enabled and Triggered subsystems.

Action subsystems. These subsystems are connected to action-initiator (e.g., an "If" or "SwitchCase" block), a block that explicitly commands the subsystem contents to execute. These subsystems are similar to Enabled subsystems except that the management of the "enabling" signal has been delegated to an action-initiator. Action subsystems define a new type of signal, called an action signal that signifies which subsystems are commanded to execute by the action-initiator.

Function-call subsystems. These subsystems provide a means of collecting blocks into a subsystem that is only executed when called by an owner block. The owner block may compute input signals for the subsystem before calling the subsystem. Additionally, the owner may also read output signals from the subsystem after calling it. Function-call subsystems define a new type of execution control signal, called a function-call signal that contains no data. It is used to define the execution relationship between the owner block and the function-call subsystem. Function-call owners may also designate themselves as an "interrupt" source. In simulation, they simulate the effects of an interrupt, and in code generation, they can attach themselves to an (asynchronous) interrupt.

While subsystems and For subsystems. These subsystems execute the constituent blocks multiple times on a given time step.

Simulink® allows for several forms of block parameters to be defined. There are two general categories of parameters: those parameters that can be modified during simulation and those that cannot be modified. An example of a parameter that may be modified during simulation is the amplitude of a Sine Wave block if configured by the user to allow modification during execution. A parameter such as the amplitude specifies coefficients of the dynamic equation, in this case the amplitude of the sine wave function defined by the Sine Wave block. An example of a parameter that can never be modified during simulation is the sample time of the Sine Wave block. The parameters that can be modified during simulation are further broken down into other categories which include mapping the dialog parameter (e.g. the amplitude) to run-time parameters or converting the dialog parameter to an inlined (non-modifiable) parameter. Run-time parameters can further be mapped to mathematical expressions of tunable Matlab variables or Matlab parameter objects describing properties of the variables (called Simulink®.Parameter's). A global run-time parameter data structure is used within Simulink® to manage the block parameters during the execution of the model.

In addition to block parameters, model-wide parameters are generally associated with the solver. These parameters include aspects such as the time span in which to perform a simulation, the type of solver, and the time span. Simulink® gives the user the ability to adjust solver parameters during model execution. The adjustment of these solver parameters is performed at the start of a time step.

Once a block diagram model has been constructed using the editor, an execution engine allows the model to be solved in order to trace the system outputs as a function of time. The solution of the model, which may be referred to as model execution, is carried out over a user-specified time span for a set of user-specified inputs. Simulation proceeds in four major stages: compilation, link, code generation, and the simulation loop. Alternatively, the execution engine can obtain a linear representation of the model (linearization). The interrelationship between the various stages is illustrated in a flowchart in FIG. 4.

The execution begins when the block diagram 40 is compiled 42. Following the compilation stage, is the model link stage 44, which may also produce linear models 46. Code may or may not be generated 45. If code is generated 48, a decision is made 49 whether to continue the simulation. If the decision is made to continue the simulation, the model is simulated/executed through the Simulation Loop 50. If the simulation is not continued, the code may be delivered to a target 52 and executed in an external mode 54. If code is not generated the block diagram may execute in interpretive mode when entering the Simulation Loop 50.

The compile stage marks the start of model execution and involves preparing data structures and evaluating parameters, configuring and propagating block characteristics, determining block connectivity, and performing block reduction and block insertion. The preparation of data structures and the evaluation of parameters creates and initializes basic datastructures needed in the compile stage. For each of the blocks, a method forces the block to evaluate all of its parameters. This method is called for all blocks in the block diagram. If there are any unresolved parameters, execution errors are thrown at this point.

During the configuration and propagation of block and port/signal characteristics, the compiled attributes (such as dimensions, datatypes, complexity, or sample time) of each block (and/or ports) are setup on the basis of the corresponding functional attributes and the attributes of blocks (and/or ports) that are connected to the given block through lines. The attribute setup is performed through a process during which block functional attributes "ripple through" the block diagram from one block to the next following signal connectivity. This process (referred to herein as "propagation") serves two purposes. In the case of a block that has explicitly specified its block (or its ports') functional attributes, propagation helps ensure that the attributes of this block are compatible with the attributes of the blocks connected thereto. If not, an error is issued. For instance, if an Integrator block is implemented to only accept numbers of double precision datatype, then this block will error out if it is driven by a block that produces single precision data, unless the user has asked for an implicit data conversion. Secondly, in many cases blocks are implemented to be compatible with a wide range of attributes. Such blocks adapt their behavior in accordance with the attributes of the blocks connected to them. This is akin to the concept of polymorphism in object-oriented programming languages. For instance, a discrete-time Filter block could be implemented to accept any of the standard integer datatypes ranging from 8-bit to 128-bit. The exact implementation of the block is chosen on the basis of the specific block diagram in which this block finds itself. Included within this step are other aspects such as validating that all rate-transitions within the model yield deterministic results and that the appropriate rate transition blocks are being used.

Figure 5:
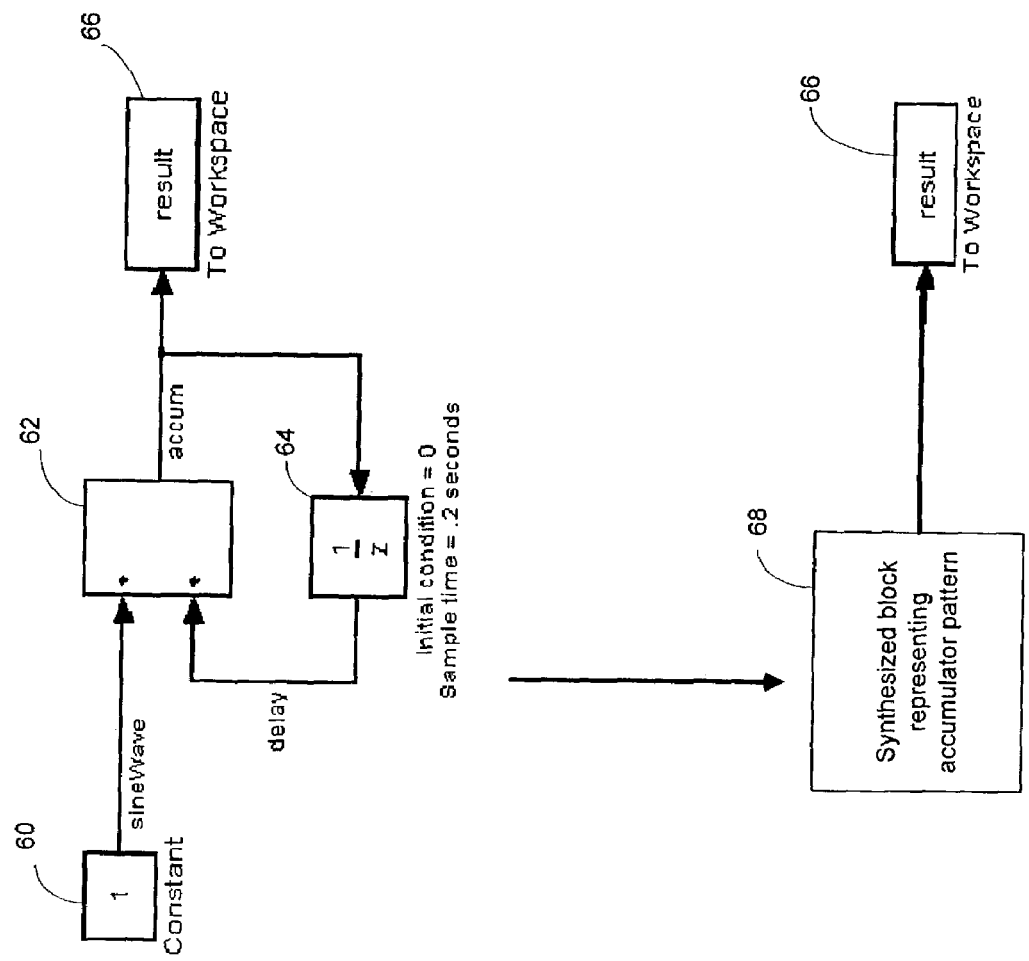
FIG. 5 depicts the replacement of a collection of blocks in a block diagram with an accumulator block.

The compilation step also determines actual block connectivity. Virtual blocks play no semantic role in the execution of a block diagram. In this step, the virtual blocks in the block diagram are optimized away (removed) and the remaining non-virtual blocks are reconnected to each other appropriately. This compiled version of the block diagram with actual block connections is used from this point forward in the execution process Once actual block connectivity has been determined (by removing the virtual blocks), the block diagram may be further optimized by performing block reduction and insertion. During this step, non-virtual blocks may be inserted or a set of non-virtual blocks may be completely removed or reduced to a single equivalent block. Block insertion and reduction is mainly done to improve execution efficiency. Examples of block insertion and reduction include the removal of Gain blocks whose gain value is 1. A Gain block is a block that multiplies its input value by a gain parameter, such as a simple amplifier. FIG. 5 depicts the replacement of a collection of blocks 60, 62, and 64 connected in a accumulator pattern and leading to result 66 with an equivalent synthesized block 68 representing the accumulator pattern leading to the same result 66. A signal copy block may also be automatically inserted in order to make contiguous memory copies of signals that are made up of disjoint memory sections. Block insertion and reduction may also be performed at other suitable stages of compilation.

The way in which blocks are interconnected in the block diagram does not necessarily define the order in which the equations (methods) corresponding to the individual blocks will be solved (executed). The actual order is partially determined during the sorting step in compilation. Once the compilation step has completed, the sorted order cannot be changed for the entire duration of the block diagram's execution.

The first step in sorting involves transforming the graphical block diagram into a compiled (in-memory) directed graph consisting of arcs and vertices. The vertices are derived from some of the non-virtual blocks. For instance, virtual and reduced blocks do not appear in the directed graph. The arcs represent data dependencies between the vertices. The data dependencies do not correspond to the signals in the block diagram. For example, all signals that connect to input ports without direct feed through are "cut" or ignored. In addition, data dependencies are added to capture implicit dependencies. For example, all inputs to a Function-Call subsystem are implicit data dependencies to the owner (caller) block.

The process of converting a block diagram into a compiled directed graph is shown in FIG. 6A. A block diagram 81 includes a Sine Wave 1 block 82, a Sine Wave 2 block 84, a Goto block 86, a Function Call Generator block 88, and a From block 90. Also included are a Function Call Subsystem block 92, a Sum block 94, a Gain block 96, an Integrator block 98 and an Outport (Output 1) block 100. Those blocks that are not virtual or reduced appear on the corresponding directed graph 111. The directed graph 111 includes a Sine Wavel vertice 112, a Sine Wave 2 vertice 114, a function-call generator vertice 116, and a function call subsystem vertice 118. Also included are a Sum vertice 120, a Gain vertice 122, an Integrator vertice 124, and an Outport 1 vertice 126. The vertices are connected by arcs.

The graph is used to sort the blocks into a linear sorted list. FIG. 6B depicts a sorted list 128 generated from the compiled directed graph 111 which includes the elements appearing as vertices in the directed graph 111 sorted into order. The root block diagram has a sorted-list associated with it. Roughly speaking, each non-virtual subsystem layer and some special block diagram elements also each have their own sorted-list. During the sorting of the graph into the list, strongly connected components are identified and flagged as algebraic loops (an example is shown in FIG. 6A consisting of the Sum 120 and Gain 122 blocks). Such loops correspond to a set of algebraic equations and are solved using iterations and perturbations during block diagram execution by solving for the algebraic variables. Algebraic variables are either specified by the user via Initial Condition blocks or chosen by the execution engine. Solving of algebraic loops is discussed further below.

Sorting must also take into consideration other user specified dependencies between the blocks. These dependencies include the concepts of priorities and placement groups. A block priority specifies the order in which the equations associated with a block are evaluated with respect to other blocks. Placement groups are a way of causing each class of block methods for a specified set of blocks to be "placed together" in the block method execution lists. The terms "data dependency" or "data precedence" as used herein refers to the arcs of the compiled directed graph and not the signals found within a block diagram. Attempting to correlate data dependencies directly to the signals found within a block diagram is incorrect and leads to the conclusion that Simulink® does not satisfy data dependencies, i.e., the execution of the operations or block methods does not satisfy data dependencies if one interprets signal connectivity as specifying data dependencies.

After compilation, the link stage commences. During this stage, physical memory allocations are made in order to prepare for execution. Buffers are allocated for block input and output data buffers, states, and work areas. Additionally, block method execution lists that are derived from the sorted list allow for execution of the block diagram. Each block method execution list is a list of block methods that are to be executed in a sequence when each method within the list has a sample hit. There is generally a set of block method execution lists associated with each layer of the block diagram that corresponds to a non-virtual subsystem. Non-virtual subsystems are either defined by the user or automatically synthesized during compilation to either efficiently execute the model or simplify the implementation of the semantics defined by Simulink®. In multi-tasking mode, the lists within each layer may be further partitioned when block diagrams have blocks with different sample rates. These lists are explained in detail below.

Those skilled in the art will recognize that while the block method execution lists are derived from the sorted list, they do not necessarily correspond one-to-one with the sorted lists. First, each block method execution lists contains only blocks that have such a block method of the given type (class) defined by the list. Second, block methods corresponding to components like the function-call subsystem do not appear on the block method execution lists because they are executed by an "owner" block.

Although included in the discussion of the compilation stage, it is not required that the time-based diagram perform the block sorting step during compilation. The sorting step is performed to achieve efficient execution. Ignoring efficiency, there is no semantic reason to perform the sorting step. Any random ordering of the block methods will work. In fact, any ordering of all block method execution lists except the Output block method execution list will result in the same level of efficiency. Randomly re-ordering the Output block method execution list will yield correct answers. If the Output block method list is randomly ordered, then the Simulation engine, when executing the Output block method execution list, continues sequencing through the Output block method execution list at each point in time until there are no changes.

Similarly included within the linking stage for the sake of simplicity, is the memory initialization of the model. The memory initialization of the model includes invoking block start, initialize, constant initialize, enable, and constant output methods. These are examples of some of the block methods that are used during model setup (prior to execution) to initialize the "state" of the system so that execution or linearization can commence.

The compiled and linked version of the block diagram may be directly utilized to execute the model over the desired time-span. This interpretive mode of execution is suitable for getting fine-grained signal traceability. It should be noted that the traceability associated with interpretive execution comes at the price of increased overhead in the form of additional execution-related data-structures and messaging in the engine. An alternative to the interpretive execution mode is to utilize the generated-code created by Real-Time Workshop tool for Simulink® models. In this mode, the engine (upon the behest of the user) translates a selected portion of the block diagram (or the entire block diagram itself) into code. Such code could be in a number of possible forms. The code may be instructions in a high-level software language such as C, C++, Ada, etc., hardware descriptions of the block diagram portions in a language such as HDL, or custom code formats suitable for interpretation in some third-party software. Alternatively, the code may be instructions suitable for a hardware platform such as a microprocessor, microcontroller, or digital signal processor, etc., a platform independent assembly that can be re-targeted to other environments, or just-in-time code (instructions) that corresponds to sections of the block diagram for accelerated performance.

The execution of a portion of the block diagram represented in code may be performed in a number of different ways based on the specific code format. The portion of the block diagram may execute a compiled version of the code generated in a high-level language (accelerated or softwarein-the-loop simulation), the execution may simulate code that corresponds to a hardware description on a hardware simulator, (co-simulation execution), the execution may involve calling out to third-party software to run code generated for such software (co-simulation execution), or the execution may call out directly to hardware that will run code that was generated and compiled for that hardware (processor-in-the-loop execution).

There are several different advantages to execution through code generation. Execution of generated code can be more efficient than interpretive execution because of fewer data-structures and lesser internal messaging in the engine, although the increased efficiency generally comes at the cost of decreased execution traceability. Simulation of hardware descriptions during execution can help identify and resolve bugs in the software stage of a design project. Such bugs prove much more expensive to track and fix once the system has been implemented in hardware. Additionally, block diagram modeling software can be integrated with other software environments that are suitable for modeling and simulating special classes of systems. Models can be tested directly in hardware thereby making prototyping of new systems fast and cost-effective. For instance, consider the design of a controller for an anti-lock braking system of a car. The dynamics of the braking system can be executed in the interpretive mode in the block diagram. The controller itself can be implemented on a hardware micro-controller to test the efficiency of the control laws implemented within. Note that for such target execution, it is normally necessary for the time span over which a model is executed by the software to match real-world time. In other words, the software must allow real-time execution of the block diagram model. Those skilled in the art will recognize that when users generate code, they may choose to not proceed further with the block diagram's execution. They may choose to take the code and deploy it outside of the confines of the modeling software environment. This is normally the last step in the design of dynamic systems in a block diagram software package.

There are several forms of target code execution known to those skilled in the art such as Rapid Prototyping, Embedded System Deployment, and Hardware-in-the-Loop which execute a model or portions of a model via the generated code on a Real-Time System target. One aspect of deploying (executing) the generated code on a target is the notion of "external mode." External mode refers to a system where Simulink® acts as a monitor and debugger of the generated code running in real-time on a target. In External Mode, users can change parameters and view signals via standard Simulink® elements. Another important aspect of the code generation technology is that it is very extensible. Provided with the Simulink® product family is the Target Language Compiler (TLC). This technology enables the creation of "active scripts" that control how the generated code is produced for a block diagram. Using TLC, one can tailor the generated code to suite their specific needs.

The execution of the block diagram uses a Simulation Loop (SimLoop) for solving for the block diagram's outputs for a specified set of inputs over a specified span of time ("Time" in reference to the Simulation Loop means the time-line corresponding to the tracing of the dynamic system's outputs, not real-world time unless otherwise noted). The term "SimLoop" applies to real-time systems where each iteration is tied to a physical periodic clock or other timer source. During this process, the block methods (equations) corresponding to the individual blocks are executed by type following their sorted order when they have a sample hit. The term "block execution" is loosely used to mean executing all block methods associated with the given block for a given time step, generally starting with the output method. Strictly speaking, blocks do not execute; the engine executes (evaluates) the appropriate block methods at the appropriate time points.

SimLoop has two variants "single-tasking" and "multi-tasking" depending on sample times. In general, the sample time of a block is the interval of time between calls to the Output, Update, and/or Derivative methods for a given block. In computing this interval, repeated calls at the same time instant (not in real-world time but the time corresponding to the execution of the dynamic system) are counted as the same call. A block's sample rate may also be thought of the interval between successive executions of the block methods. If there is no uniform or regular interval between calls, then the block is said have a continuous sample time. If a uniform time interval can be found, then the block is said to have a discrete sample-time equal to that interval. Although blocks may be associated with more than one sample time in a sufficiently complex dynamic system the descriptions contained herein are confined to blocks with a single sample-time. Those skilled in the art will recognize that the descriptions may be extended to encompass blocks with multiple sample times.

Figure 7A:
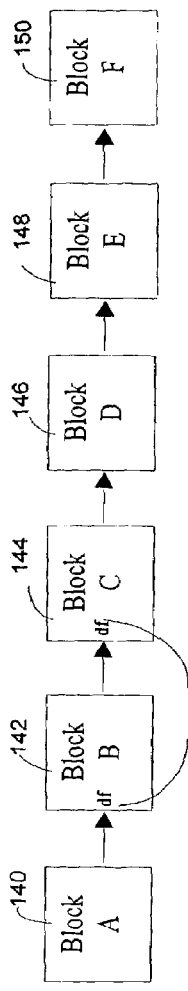
FIG. 7A depicts an abstract example of a block diagram being executed.
Figure 7B:
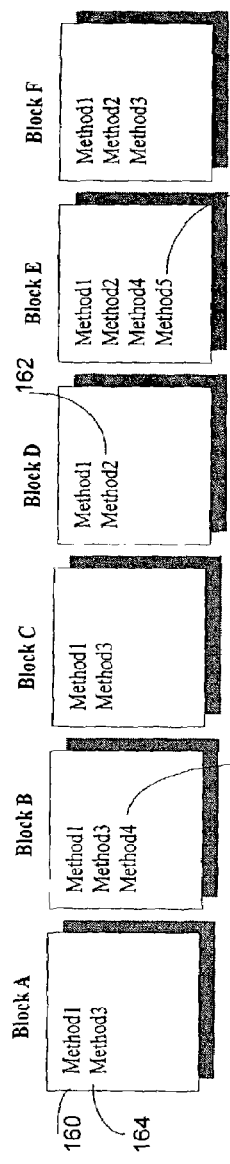
FIG. 7B depicts an abstract view of the execution methods instantiated by the blocks depicted in FIG. 7A.
Figure 7C:
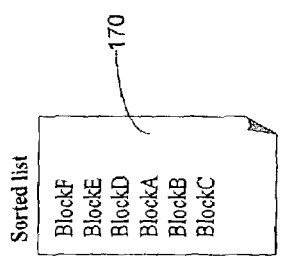
FIG. 7C depicts a sorted list generated from the data dependencies between blocks of FIG. 7A.

FIG. 7A depicts an abstract example of a block diagram being executed. The diagram includes a plurality of blocks 140, 142, 144, 146, 148 and 150. The block ports that have direct feedthrough are explicitly marked (using the symbol 'df') 152. Additionally, an abstract view of the execution methods instantiated by each block is shown in FIG. 7B. The blocks contain a number of different methods 160, 162, 164, 166, and 168. Execution methods includes the three basic execution methods discussed earlier: Output, Update, Derivative, as well as several other methods that aid in advanced block functions such as initialization, linearization and zero-crossing detection (which are discussed below). The data-dependencies between the compiled vertices created during sorting are used to generate the Sorted List 170 shown in FIG. 7C.

Figure 8:
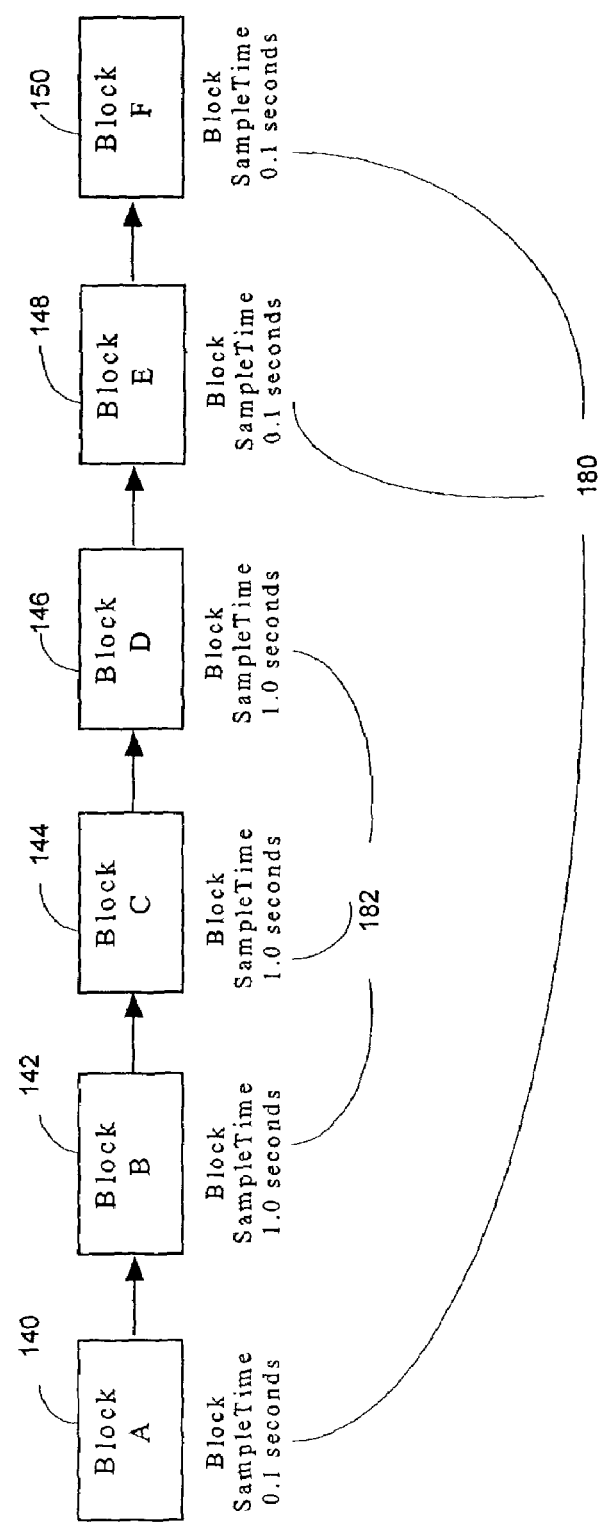
FIG. 8 depicts a multi-rate system.

A block diagram consisting of blocks that all have the same sample time is said to correspond to a single-rate system. A block diagram consisting of blocks that have more than one sample time corresponds to a multi-rate system. FIG. 8 depicts a multi-rate system, adding sample-time information to the block diagram of FIG. 7A. The plurality of blocks 140, 142, 144, 146, 148, and 150 each have an associated sample time. Since the sample times in the block diagram differ between blocks, the system is considered a multi-rate system. Block A 140, block E 148, and block F 150 each have a sample time of 0.1 seconds. Block B 142, block C 144, and block D 146 each have a sample time of 1.0 seconds.

The SimLoop is the heart of the execution engine. Each full pass through the loop is responsible for computing the outputs of the system at a particular time. At the end of each loop, the execution time corresponding to the next pass through the loop is computed. If this time exceeds the stop time specified by the user, the execution terminates. Within the loop, the sequence in which individual block equations are solved is determined by two pieces of information: the sample times of the blocks and the sorted order determined during the Compile stage. The amalgamation of these two pieces of information gives the execution lists for the block diagram. Those skilled in the art will recognize that the execution lists are created in the Link stage and are explained in the context of SimLoops for convenience. There are two distinct approaches for building execution lists and using them in the SimLoop. These approaches correspond to the Single-tasking and Multi-tasking SimLoops summarized in the discussion on FIG. 10 below.

Simulink® also has the ability to modify coefficients (parameters) of blocks that declare their parameters as tunable. An example of a block is a Sine Wave block that implements the function output (time)=Amplitude*sin(frequency*time+phase)+bias, where time is the independent variable and the parameters are: amplitude, frequency, phase, bias. When these parameters are declared as tunable, Simulink® lets the user change these coefficients during simulation. Changing parameters is a drastic operation in that the definition of the model has changed (e.g. the sine block defines equations that describe the system). Thus, to enable the changing of parameters during the SimLoop, Simulink® first queues parameter changes and then applies them on the next time step. Thus, the changing of parameters is not immediate. The delay in the changing of parameters is needed to ensure system stability. The application of the parameters at the start of the next time step is combined with the reset of the solver (Integrator) if needed.

Figure 9:
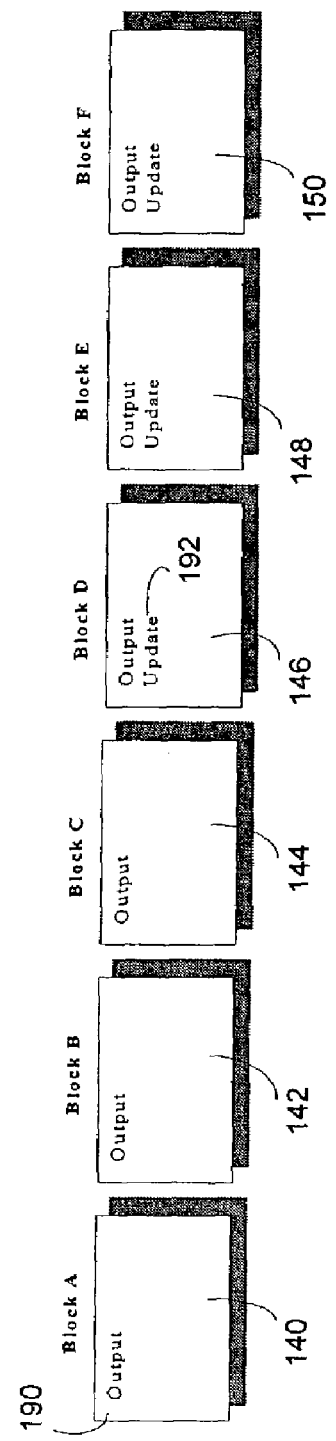
FIG. 9 depicts the block diagram of FIG. 7A and FIG. 8 with associated methods added to the blocks.

For the purpose of exploring single-task loops and multi-task loops, FIG. 9 depicts the block diagrams of FIG. 7A and FIG. 8 where Method1 corresponds to the Output method 190 and Method2 corresponds to the Update method 192. All other methods are ignored in the explanation of the loops. Simpler loops which do not include blocks that have continuous sample times are used in the example because: the explanation is simpler in the context of discrete sample times and it is straight-forward to extend to continuous sample times.

Figure 10:
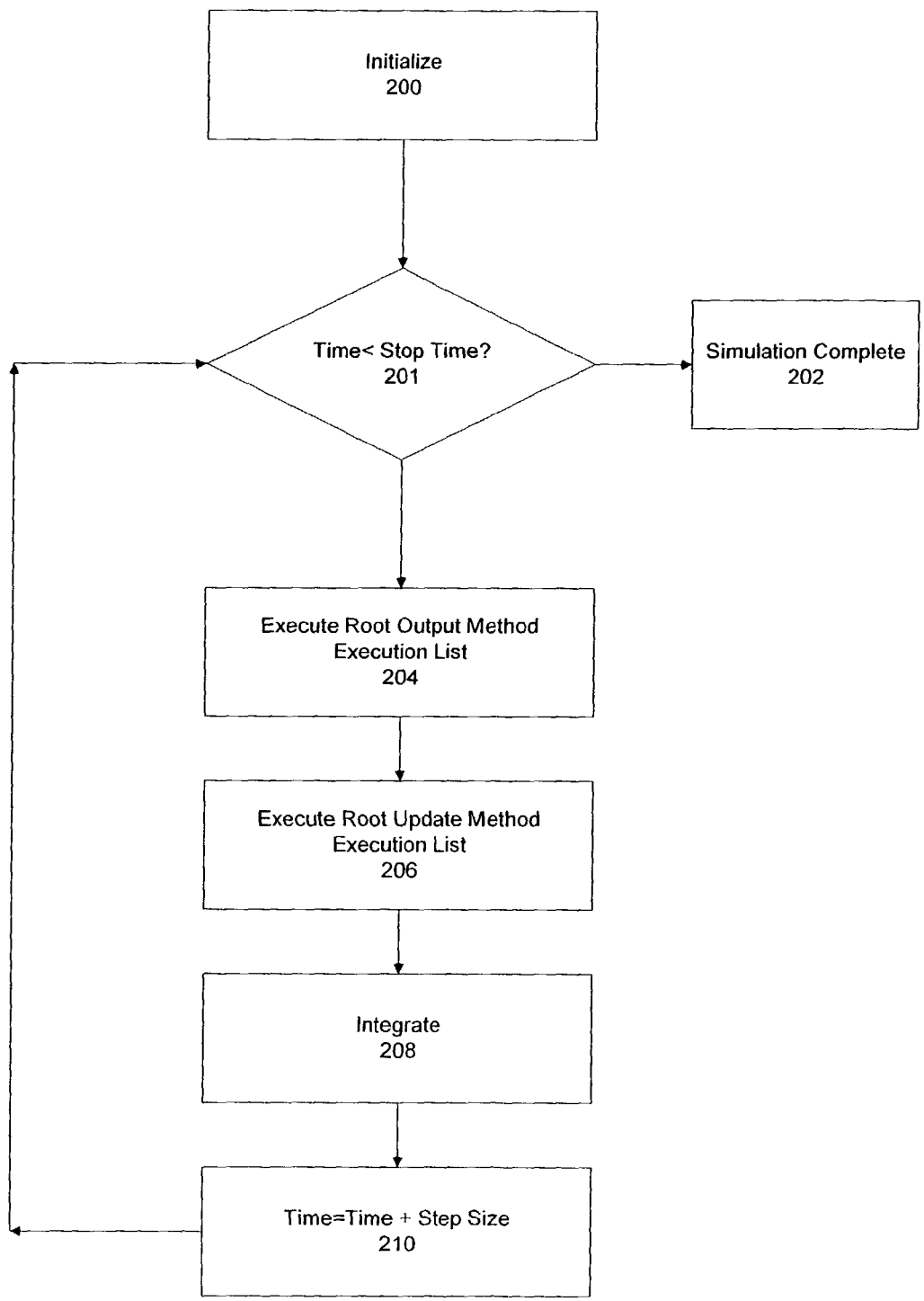
FIG. 10 is a flowchart of the sequence of steps followed by a single-tasking execution loop.

In a single-tasking SimLoop, there is essentially a single execution time-line. On this time-line, each block is executed when it has a sample hit. A sample hit is defined to an execution time instant that is an integer multiple of the block's sample time. To aid in execution, execution lists are constructed for each method type. FIG. 10 depicts the sequence of steps followed by a single-tasking execution loop. Following initialization (step 200), a time parameter is checked to see if the current time is less than the stop time (step 201). If the time is not less than the stop time, the simulation ends (step 202). If the time is less than the stop time, the simulation continues and the root output method execution list is executed (step 204). Following execution of the output method list (step 204) the update method execution list is executed (step 206). Following the performance of an integrate step (208)(the Integrate step is described more below in FIG. 14), the time parameter is incremented by the applicable step size (step 210).

Figure 11A:
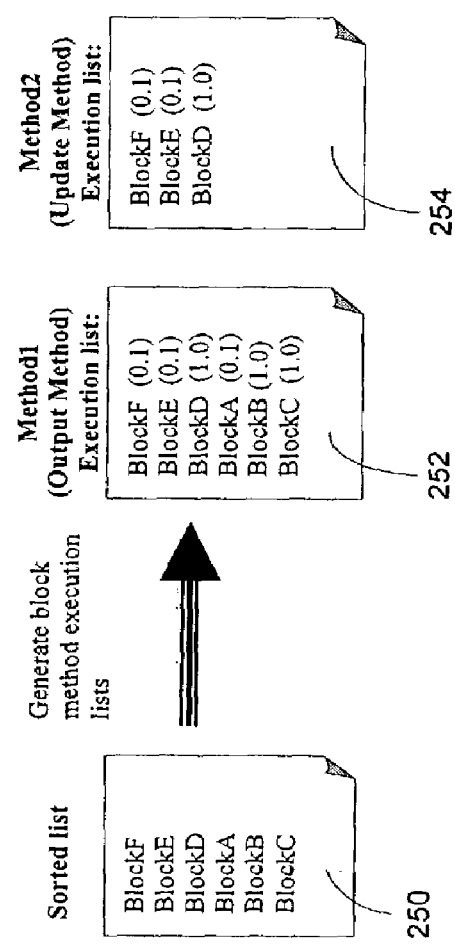
FIG. 11A depicts the creation of execution lists from sorted lists in single task mode.

Blocks are arranged in the single-tasking execution lists in the sorted order as shown in FIG. 11A. A sorted list 250 is used to generate an Output method execution list 252 and an Update method execution list 254. Referring back to the example in FIGS. 7 and 8, the engine sequentially steps through and execute each block in the block method execution list when the execution time divided by the sample time equals an integer number (1, 2, 3, 4, etc.). At time zero (TO), all the blocks are executed. This involves executing the Output methods for blocks F, E, D, A, B, and C (in this order as dictated by the sorted list) and then executing the Update methods of blocks F, E, and D (again, in this order based on the sorted list). The execution time then is then incremented by step size, which in this case is assumed to be 0.1 seconds. Execution then commences once again at the top of the loop for T=0.1 (T0.1). Blocks F and E have a sample time of 0.1 seconds and have a sample hit (0.1/0.1=1, sample time is an integer multiple of the execution time), so the output block methods for Blocks F and E are executed. Block D, however, has a 1.0 second sample time and has no sample hit (0.1/0.1=0.1, sample time is not an integer multiple of the execution time), so its output block method is not executed (essentially it is skipped). Block A, like Blocks F and E, has a 0.1 second sample time and so its output block method is executed. Blocks B and C, like Block D, have 1.0 second sample times and are skipped during this iteration of the simulation loop, which completes execution of the output block method execution list for $T_{0.1}$.

The execution timing of the example block diagram in single task mode is shown in the first time-line of FIG. 11B. In this diagram, note that the execution time is not synchronized with real-world time. Instead, execution time progresses as fast as it can in real-world time. The sorted list 259 is executed on the time-line 260. The methods in the list 262 are executed at the appropriate time step 264. Block diagram modeling software can also allow users to simulate real-world conditions by synchronizing execution time with real-world time. Such execution is illustrated in the second timing diagram of FIG. 11B. The methods 262 are implemented at a time-step 264 synchronized with real world time on the time line 270.

Figure 12A:
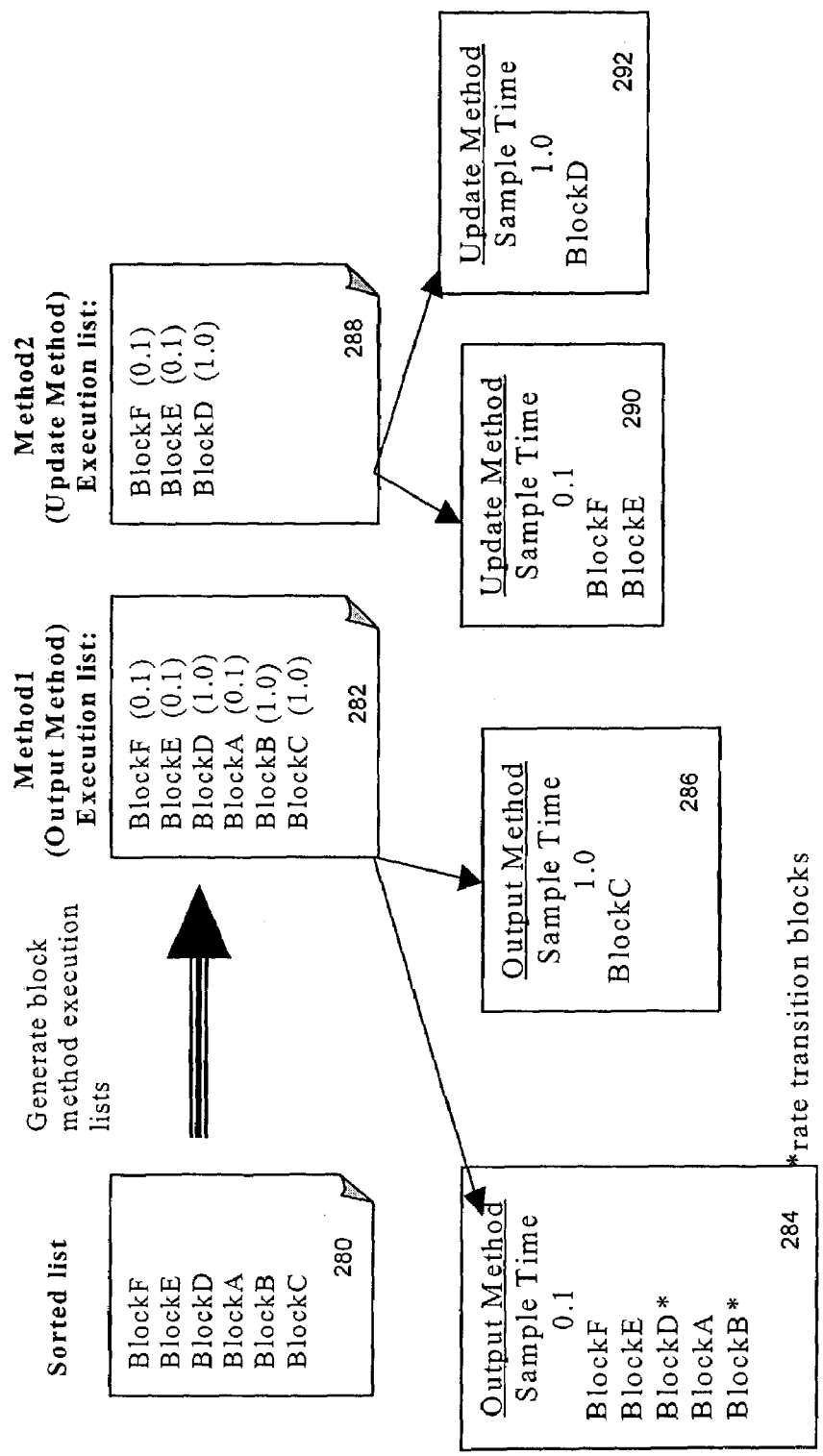
FIG. 12A depicts the creation of execution lists from sorted lists in multi-task mode.
Figure 13:
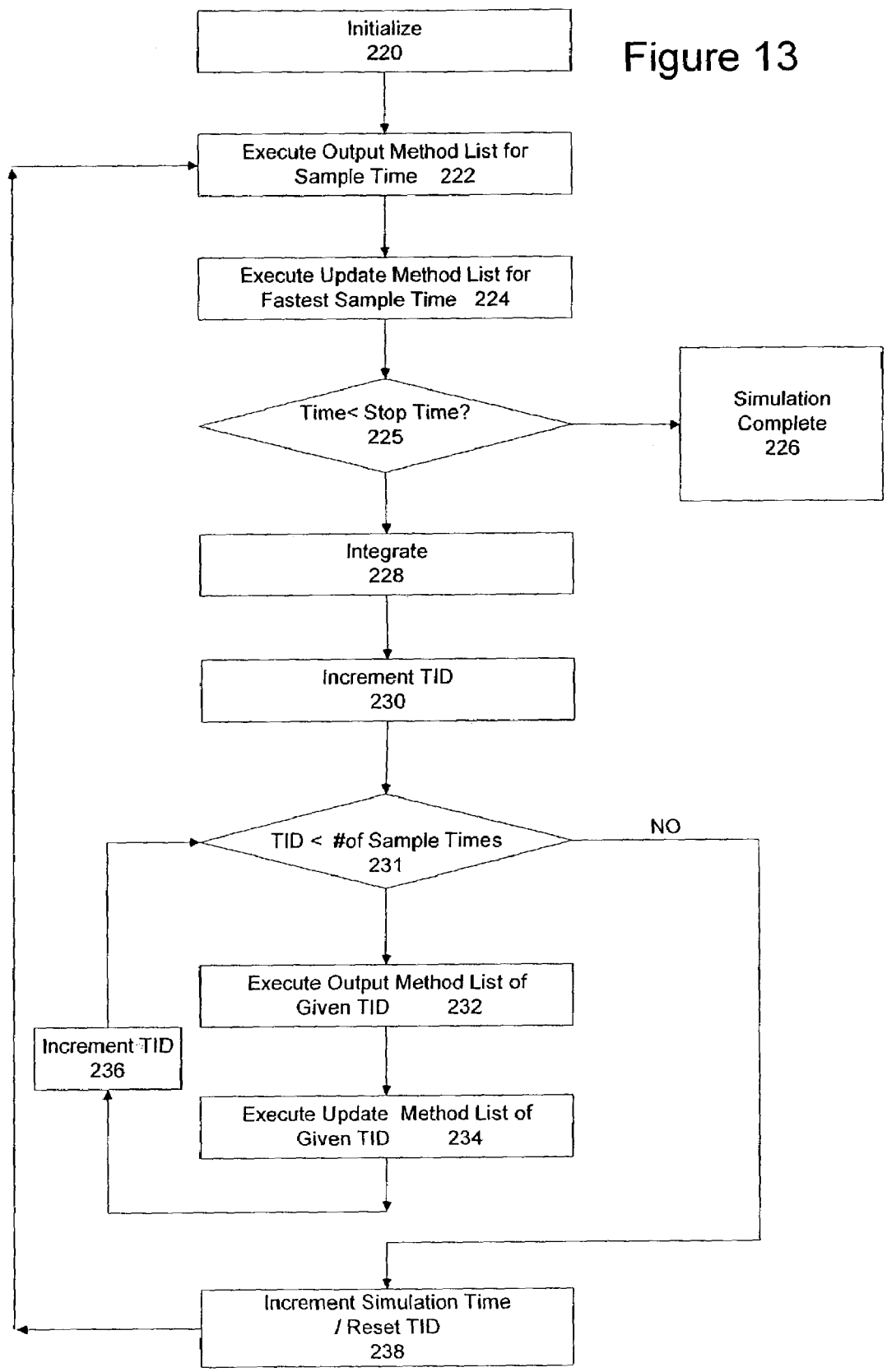
FIG. 13 is a flowchart of the overall sequence of steps taken by Simulink® in multi-task mode.

In multitask mode, the engine performs execution along multiple time-lines based upon the number of block sample times used in the mode, as shown in the flowchart of FIG. 13. In the example of FIGS. 7 and 8, the model's blocks have a sample time of either 0.1 seconds or 1.0 second. This implies that the engine runs one set of blocks along a 0.1 second time line and another set of blocks along a 1.0 second time line. In order to run in multitask mode, the execution lists are first divided based on methods (as in single-tasking mode) and then subdivided again based upon block sample times. This is illustrated in FIG. 12A. The sorted list 280 is used to generate an output method execution list 282 and update method execution list 288. The output method execution list 282 is split into two separate list execution lists 284 and 286 based on sample times. Similarly, the update method execution list 288 is divided into two update method execution lists 290 and 292 based on sample times.

The execution engine uses the divided execution lists to create multiple execution time lines. In the multitask mode, the engine places a higher execution priority on the faster sample time blocks than the slower sample time blocks. This prioritization is carried out by assigning Task Identification Numbers (TIDs) to each execution list; the higher the priority, the lower the TID. For example, a TID of 0 executes at a higher priority than a TID of 1, and so forth. Furthermore, because, during execution in multitask mode, execution transitions between the faster and slower blocks, and vice-versa, the multitask mode requires rate transition blocks that allow the model to transition from blocks running at fast sample times, in our example 0.1 seconds, to slower samples times, e.g., 1.0 seconds. The rate transition blocks are required to correctly simulate how a multi-rate system would behave in a real-time environment. To provide this transition, the engine promotes rate transition blocks to the TID of the fast block for which transition is being provided, although the engine executes these rate transition blocks at their slower rate. This is why Blocks D and B appear in the 0.1 sample time output method execution list in FIG. 12A.

Figure 12B:
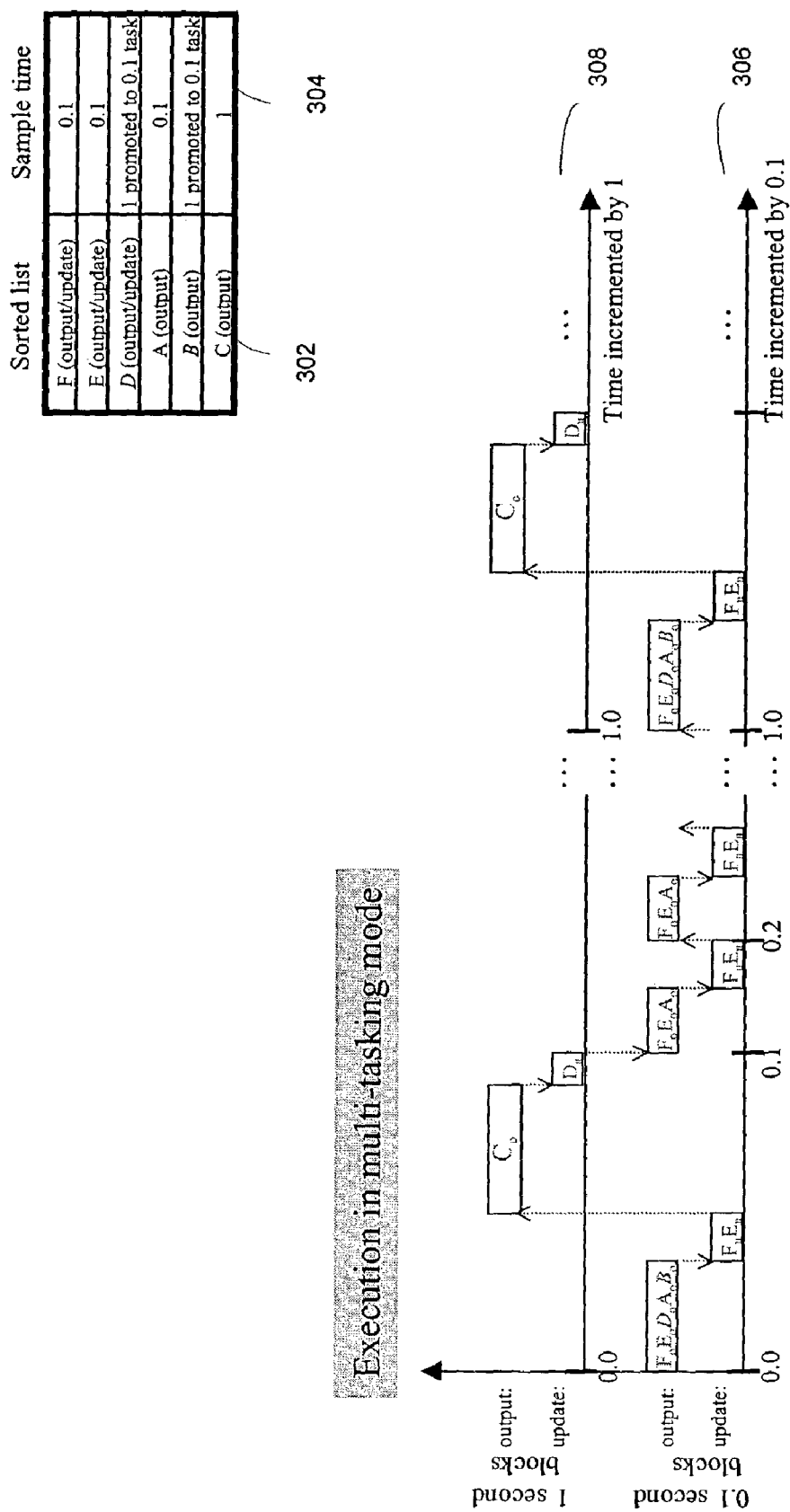
FIG. 12B depicts the execution timing of block diagrams in multi-task mode.

The execution of our example in the multitask mode may be seen in FIG. 12B. At time T=0, the engine first executes the high priority output methods (those with TID j) for Blocks F, E, D, A and B, then it executes the high priority update methods (those with TID 0) for Blocks F and E. After finishing the high priority blocks, the engine executes the lower priority output block methods (those with TID 1) for Block C, and then executes the lower priority update methods (those with TID 1), which, in this example, is Block D. In contrast to the single task mode, in multitask mode the engine runs through a TID inner loop to execute the output and update block methods before going on to the Integration step, as the flow chart in FIG. 13 which is discussed below illustrates.

As a result of the inner TID loop, as well as the segregated block method execution lists, the order of execution in multitask mode differs from the order of execution in single task mode. Recall for the example that in single task mode that the order of execution at T=0 is: $F_o$, $E_o$, $D_o$, $A_o$, $B_o$, $C_o$, $F_u$, $E_u$, and $D_u$, where the subscript "o" stands for output method and the subscript "u" stands for update method. In the multitask mode, however, the order of execution at T=0 is: $F_o$, $E_o$, $D_o$, $A_o$, $B_o$, $F_u$, $E_u$, $C_o$, and $D_u$. Notice that $C_o$ is executed in a different order in multitasking mode. This occurs because separate method execution lists (based upon sample time) are created and run in order from fasted sample time to slowest sample time. Additionally, the use of rate transition blocks restricts the connection of blocks with different rates. By requiring the insertion of these blocks into the model, the engine ensures that execution in multitask mode will follow the sorted list.

After it is finished executing the block methods for T=0, like in the single task mode, the execution time is incremented (again assume by 0.1 seconds) and execution goes to the beginning of the loop. The engine executes $F_o$, $E_o$, $A_o$, $F_u$, and $E_u$, and the engine does not execute the block methods of Blocks D, B, and C because the current execution time is not an integer multiple of those block's sample time. The engine repeats this execution until the execution time is incremented to 1.0 seconds, whereupon execution occurs in the same manner as described for T=0. The engine repeats this overall process until the execution stop time is reached.

FIG. 12B shows two time-lines; the lower time-line 306 represents the execution order of the faster sample time blocks (Blocks A, E, and F), along with the rate transition blocks (Blocks B and D), while the top time-line 308 shows the execution order of the slower sample time block (Block C), and the rate transition (Block D) update method. The time-lines are generated from the sorted list 302 and the associated sample times 304. The lower line, representing the faster sample times has a TID of 0, and the top line has a TID of 1. For execution time T=0, the chart shows that the engine executes the output methods for Blocks F, E, D, A, and B (designated on the chart as $F_o$, $E_o$, $D_o$, $A_o$, $B_o$). Then, consistent with the flow chart for the multi-tasking mode (see FIG. 13 discussed below), the engine executes the update block methods for Blocks F and E (designated $F_u$, and $E_u$). Once the engine is finished with the high priority block methods, the output method for Block C ($C_o$) and the update method for rate transition block D ($D_u$) are executed. The execution time is then incremented by the step size (continue to assume 0.1 seconds) and the blocks that have a sample hit are executed. The figure shows execution of $F_o$, $E_o$, $A_o$, $F_u$, and $E_u$, which is repeated, as noted above, until execution time equals 1.0 second. Notice, like in the non-real-time case for Single-task mode, the engine does not wait for time to elapse; rather it executes block methods immediately upon completion of the previous pass through the loop.

FIG. 13 shows the overall sequence of steps taken by Simulink® in multitask mode. Following initialization (step 220), the output method execution list is executed for the fastest sample time (step 222). The update method execution list is then executed for the fastest sample time (step 224). A time parameter is checked (step 225) to determine to determine if the time is less than a designated stop time. If the stop time has been reached, the simulation completes (step 226). Otherwise, the integrate stage (step 228) is performed. The task ID variable is incremented (step 230) and compared to a parameter of the number of sample times (step 231). If the task ID is less than the number of sample times, the output method execution list for the methods assigned the new task ID are executed (step 232) followed by the execution of the update method execution list assigned the new task ID (step 234). The task ID variable is incremented and the process iterates with the task ID being compared to the number of sample rate times (step 231). When the task ID number is determined to equal the number of sample rate times, the simulation time is incremented (step 238) and the entire process iterates with the output method list execution list (step 222) being executed for the fastest sample times. The process continues until the end of simulation when the time equals the stop time (step 226).

In order to understand how the step size is picked within SimLoop, it is first necessary to understand the notion of a solver. The solver is a module of the execution engine that is responsible for performing two tasks: (a) determining how far execution time should be advanced between consecutive passes through the SimLoop in order to accurately trace the system's outputs, and (b) integrating the derivative of the states of the system to obtain the actual states. Based on how solvers perform the first task, they are generally classified into two basic classes: Fixed-step solvers or Variable-step solvers.

Fixed-step solvers are solvers in which the time step-size between consecutive passes through the SimLoop is a fixed quantity. The user generally explicitly specifies this quantity. These solvers are used to model types of systems that must operate within a defined time (discrete systems). For instance, an anti-lock braking system may be designed to control a car's braking system, and to execute such control in one-one hundredth (0.01) of a second so as to assure the car stops safely; if the braking system does not meet its timing constraints, the car may crash. Fixed-step solvers, therefore, are designed to help model discrete systems that have to generate a result in a fixed time period, and the fixed-step execution assures that the modeled system can generate such results.

Variable-step solvers are designed to model continuous systems where non-evenly spaced time steps are needed to simulate all significant behavior. For example, one may want to simulate the path of a bouncing ball, where it bounces, how high it bounces, and where it stops. It is known, based on experience, that the ball's bounces will not be evenly spaced, and that the height of the bounces will diminish as a result of gravity, friction, and other forces. Variable-step solvers are used for these types of continuous systems and to determine what step size to use so that the behavior of the ball will be accurately modeled.

The two broad classes of solvers are further subdivided based on the integration task they perform. There are several algorithms for carrying out numerical integration. The particular choice of the integration algorithm gives rise to the subclasses of solvers.

Figure 14:
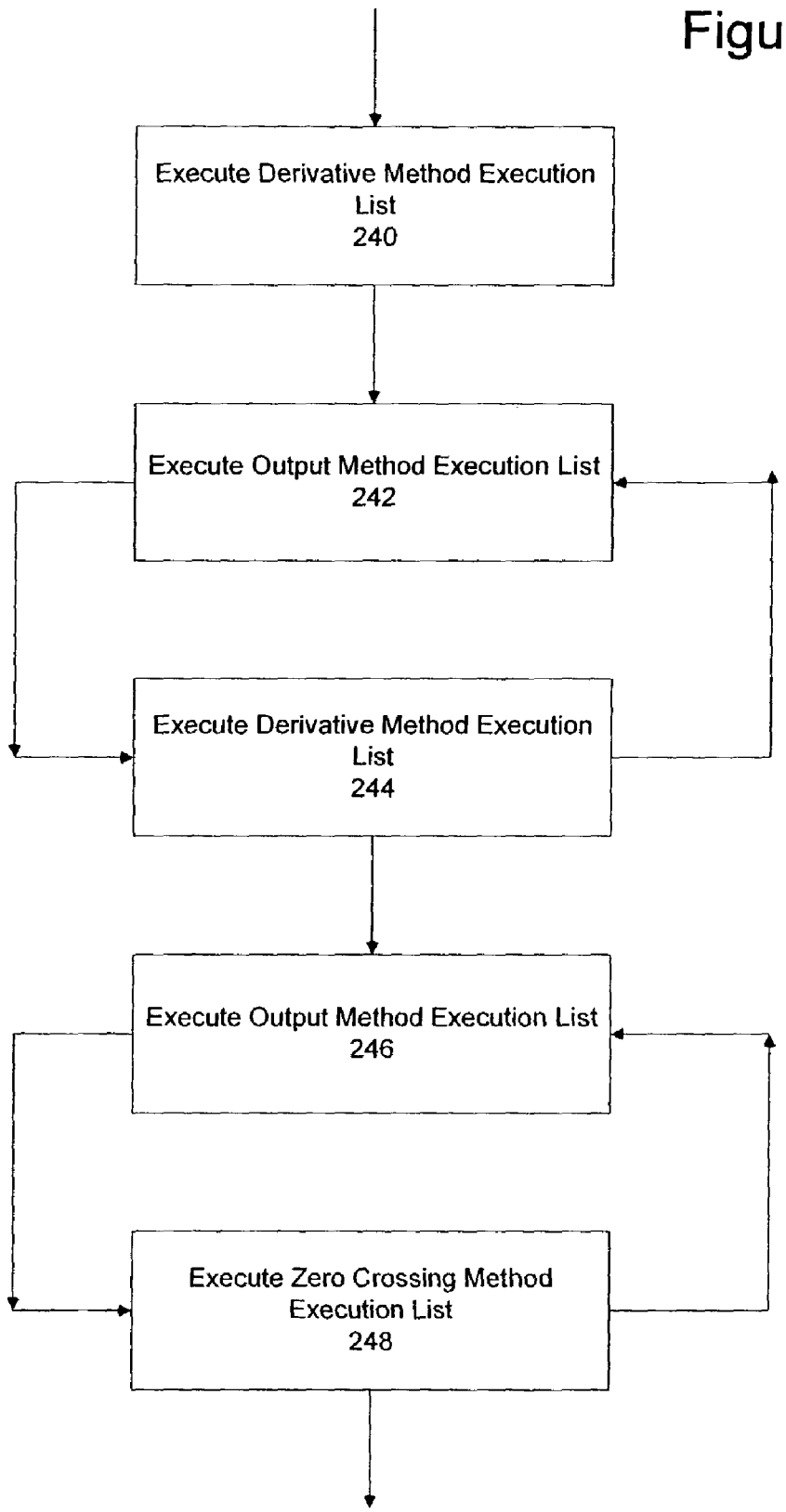
FIG. 14 is a flowchart of the sequence of steps followed by a variable-step solver.

The difference in the conceptual definition of Fixed- and Variable-step solvers leads to the functional difference in the context of the SimLoop. The major difference between the solvers arises in the Integrate step of the SimLoop that is depicted in FIG. 14. During the Integrate step, the Variable-step solver executes the Output and Derivative block method lists for a number of iterations that varies based on the solver subclass (i.e., the numerical integration algorithm it uses) and integration error tolerances. In a fixed-step solver, the number of iterations is fixed for a given solver subclass. Another difference between solvers arises in the Integrate phase in the context of an operation known as zero-crossing detection. Zero-crossings in the derivatives of the state generally indicate a discontinuity in the states themselves. Because discontinuities often indicate a significant change in a dynamic system, it is important to trace the system outputs precisely at such points. Otherwise, the outputs of the model could lead to false conclusions about the behavior of the system under investigation. Consider again the example of the bouncing ball. If the point at which the ball hits the floor occurs between simulation steps, the simulated ball appears to reverse position in midair. This might lead an investigator to false conclusions about the physics of the bouncing ball. To avoid such misleading conclusions, it is important that the execution has time steps on and around the vicinity of discontinuities.

In the case of Fixed-step solvers, there is no notion of zero-crossing detection and one is not guaranteed to find all points of discontinuity. One can only keep reducing the step-size to increase the probability of hitting the discontinuity. In contrast, in the case of Variable-step solvers, the Integrate step explicitly includes zero-crossing detection. The execution step size is then adjusted accordingly to ensure that discontinuities are tracked accurately. To enable zero-crossing detection, blocks that can produce discontinuities instantiate a special execution method. This method registers a set of zero-crossing variables with the execution engine, each of which is a function of a state variable that can have a discontinuity. The zero-crossing function passes through zero from a positive or negative value when the corresponding discontinuity occurs. During the zero-crossing detection phase of the Integration step, the engine asks each block that has registered zero-crossing variables to update the variables for the projected time of the next time step. These variables are then checked for a change of sign since the current step. Such a change indicates the presence of a discontinuity. An iterative process then tries to narrow down the location of the discontinuity and ensure that the next few time steps (at least 2) accurately bracket the location of the discontinuity. The final difference, which is in the step-size during execution, is a direct consequence of the two previous differences in the step-size determination. In Fixed-step solvers, the step size is a known and fixed quantity. For Variable-step solvers, the step size is determined during the integration iterations and the zero-crossing detection that happens during the Integration step.

An example of the variable-step solver is shown in FIG. 14, the derivative method execution list is executed (step 240) followed by the output method execution list (step 242). The derivative method execution list is then executed again (step 244) and the solver iterates between the execution of the output method execution list (step 242) and the execution of the derivative method execution list (step 244). A similar iteration loop then occurs between the execution of the output method execution list (step 246) and the execution of the zero-crossing method execution list (step 248). Note that Simulink® also includes other methods, such as Projections and Jacobians, in this step as needed.

While it is theoretically possible to have Variable-step solvers in the context of multitasking, such a combination is not employed in practice. This is because the step-size for such solvers can become very small making it impossible to keep up with the real-time constraint that generally goes along with multitasking execution. An added complication is that the integration step in such solvers is iterative and takes varying amounts of time at each step of the execution. Therefore, Variable-step solvers are generally used only in conjunction with the Single-Tasking SimLoop. Additionally, they are not usually employed in systems that need to operate in real-time.

When a model contains an algebraic loop, the engine calls a loop solving routine at each time step. The loop solver performs iterations and perturbations to determine the solution to the algebraic condition (if it can). One possible approach to solving the algebraic equation F(z)=0, is to use Newton's method with weak line search and rank-one updates to a Jacobian matrix of partial derivatives. Although the method is robust, it is possible to create loops for which the loop solver will not converge without a good initial guess for the algebraic states z. Special blocks are generally provided to specify an initial guess of the states in the algebraic loop.

In addition to the various forms of the SimLoop, modeling packages such as Simulink® use the output of the Link stage to compute linear models through a process generally referred to as model linearization. These linear models may be used in the SimLoop at various points in the execution of the overall model. Alternatively, the linear model may be returned to the user. The linearization process involves the use of a Jacobian method defined on blocks and numerical Jacobian algorithm.

Information related to the compiled block diagram may be presented to users in an automatically generated report. This report allows users to quickly obtain documentation of the functional description of their model. Information related to the execution of a particular model (such at the time taken to execute various portions of the model and the coverage of various portions of the model) may be obtained automatically and presented to the user as a report.

Description of the Linearization Process

In many cases, accurate models of physical systems require very complex descriptions. Unfortunately, the design tools for control systems can only be applied to simpler models. A standard approach for control system design is to develop a physical model using complicated descriptions and implement it in a block diagram programming tool. In block diagram programming languages like Simulink®, the user can specify the operating conditions through settings in each block in the model. Once the operating conditions are set, the model is then analyzed using approximation techniques to reduce the model to a simple form for analysis. The approach most widely used approximation technique is the process of linearization.

The process of linearization is the approximation of complex physical models that yields a sufficiently simple model for engineering analysis tools. Linearization is a well-known commonly used analysis tool that has been documented in many control textbooks. A fundamental principle of linearization analysis is that the approximation of a complex physical model (i.e. a non-linear equation or set of equations) is accurate for regions near a baseline or operating condition. In general, for the linearization of a complex physical system the approximation is accurate near the selected operating condition, where a linear equation can be defined within a limited operating parameter.

A large class of physical systems is typically modeled using sets of nonlinear differential equations of motion. The differential equations are written in the form:

$$\dot{x}(t) = f(x(t), u(t))$$

$$y(t) = g(x(t), u(t)) \tag{b}$$

Where:

t=time x(t)—A vector of model states of length n $\dot{x}(t)$—A vector of the state derivatives of length n u(t)—A vector of model inputs of length p y(t)—A vector of model outputs of length q f(x(t),u(t))—A nonlinear function which maps x(t) and u(t) to the state derivatives $\dot{x}(t)$ g(x(t),u(t))—A nonlinear function which maps x(t) and u(t) to the model outputs y(t).

Figure 17:
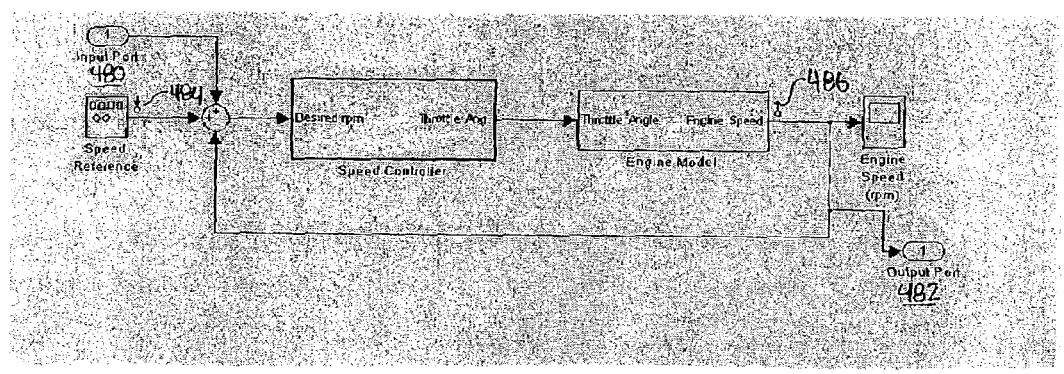
FIG. 17 is another example block diagram of the cruise control system of FIG. 16.

In block diagram programming languages, the inputs u(t) and the outputs y(t) are specified by a user. In Simulink®, these linearization points are specified in two ways. The first approach is to add an input port 480 and an output port 482 to a model as shown in FIG. 17. The input port 480 signifies a linearization input and the output port 482 signifies a linearization output. Alternatively, the linearization points can be specified on signals 484 and 486 in the model. FIG. 17 shows a model with a linearization input marked on the signal 484 originating from the block entitled speed reference. The linearization output is marked on the signal 486 originating from the Engine Model block. Therefore, the linearization of the model will contain the effects of changes in the Engine Speed Reference on the Engine Speed.

In block diagram programming languages, the nonlinear functions f(x(t),u(t)) and g(x(t), u(t)) are a result of the construction of a model. The choice of the blocks, block interconnectivity, and the operating conditions of the model, define these functions.

Linearization is a process of approximating a set of nonlinear differential equations about an operating condition where the states are at a nominal value $x(t)=x_0$ and the model inputs are at a nominal value $u(t)=u_0$. Linearization uses a first order Taylor series approximation of (b) to give $$\dot{x}(t) \approx f(x_0, u_0) + \frac{\partial f}{\partial x}\bigg|_{\substack{x=x_0 \\ u=u_0}} (x(t) - x_0) + \frac{\partial f}{\partial u}\bigg|_{\substack{x=x_0 \\ u=u_0}} (u(t) - u_0) \quad (c)$$

$$\dot{y}(t) \approx g(x_0, u_0) + \frac{\partial g}{\partial x}\bigg|_{\substack{x=x_0 \\ u=u_0}} (x(t) - x_0) + \frac{\partial g}{\partial u}\bigg|_{\substack{x=x_0 \\ u=u_0}} (u(t) - u_0).$$

Defining variables about the operating point:

$$\Delta x(t) = x(t) - x_0$$

$$\Delta u(t) = u(t) - u_0 \quad (d)$$

$$\Delta y(t) = y(t) - g(x_0, u_0)$$

gives $$\Delta \dot{x}(t) \approx \frac{\partial f}{\partial x}\bigg|_{\substack{x=x_0 \\ u=u_0}} \Delta x(t) + \frac{\partial f}{\partial u}\bigg|_{\substack{x=x_0 \\ u=u_0}} \Delta u(t) \quad (e)$$

$$\Delta y(t) \approx \frac{\partial g}{\partial x}\bigg|_{\substack{x=x_0 \\ u=u_0}} \Delta x(t) + \frac{\partial g}{\partial u}\bigg|_{\substack{x=x_0 \\ u=u_0}} \Delta u(t).$$

or more commonly described as $$\Delta \dot{x}(t) \approx A \Delta x(t) + B \Delta u(t)$$

$$\Delta y(t) \approx C \Delta x(t) + D \Delta u(t) \quad (f)$$

where the matrices $$A = \frac{\partial f}{\partial x}\bigg|_{\substack{x=x_0 \\ u=u_0}} \quad B = \frac{\partial f}{\partial u}\bigg|_{\substack{x=x_0 \\ u=u_0}} \quad (g)$$

$$C = \frac{\partial g}{\partial x}\bigg|_{\substack{x=x_0 \\ u=u_0}} \quad D = \frac{\partial g}{\partial u}\bigg|_{\substack{x=x_0 \\ u=u_0}}$$

are known as the Jacobian matrices. It is the task of a block diagram programming language tools to find the matrices A, B, C, and D.

In many block diagram programming tools physical models can be described by continuous differential equations, discrete equations of motion, and hybrids of continuous and discrete equations. These systems can additionally be referred to as multi-rate systems. This more general description of a multi-rate system is described by $$\dot{x}(t) = f(x(t), x_1(k_1), \ldots, x_m(k_m), u(t)) \quad (h)$$

$$x_1(k_1 + 1) = f_1(x(t), x_1(k_1), \ldots, x_m(k_m), u(t))$$

$$\vdots \qquad \vdots$$

$$x_m(k_m + 1) = f_m(x(t), x_1(k_1), \ldots, x_m(k_m), u(t))$$

$$y(t) = g(x(t), x_1(k_1), \ldots, x_m(k_m), u(t))$$

where t=time x(t)—A vector of model continuous model states of length n $\dot{x}(t)$—A vector of the state derivatives of length n $x_i(k_i)$—A vector of model discrete model states of length $n_i$ at a sample time $k_i$ u(t)—A vector of model inputs of length p y(t)—A vector of model outputs of length q $f(x(t), x_1(k_1), \ldots, x_m(k_m), u(t))$—A nonlinear function which maps $x(t), x_1(k_1), \ldots, x_n(k_m)$ and u(t) to the state derivatives $\dot{x}(t)$ $f_i(x(t), x_1(k_1), \ldots, x_m(k_m), u(t))$—A nonlinear function which maps $x(t), x_1(k_1), \ldots, x_m(k_m)$ and u(t) to the update of the discrete state $x_i(k_i)$ $g(x(t), x_1(k_1), \ldots, x_m(k_m), u(t))$—A nonlinear function which maps which maps $x(t), x_1(k_1), \ldots, x_m(k_m)$ and u(t) to the model output y(t)

The conventional approach for this type of problem is to approximate this multi-rate system by a single rate discrete system:

$$\Delta x(k+1) \approx A \Delta x(k) + B \Delta u(k)$$

$$\Delta y(k) \approx C \Delta x(k) + D \Delta u(k) \quad (i)$$

It is the task of a block diagram programming language tools to find the matrices A, B, C, and D. This is a well known and understood problem and has been implemented in many block diagram programming languages.

Figure 15:
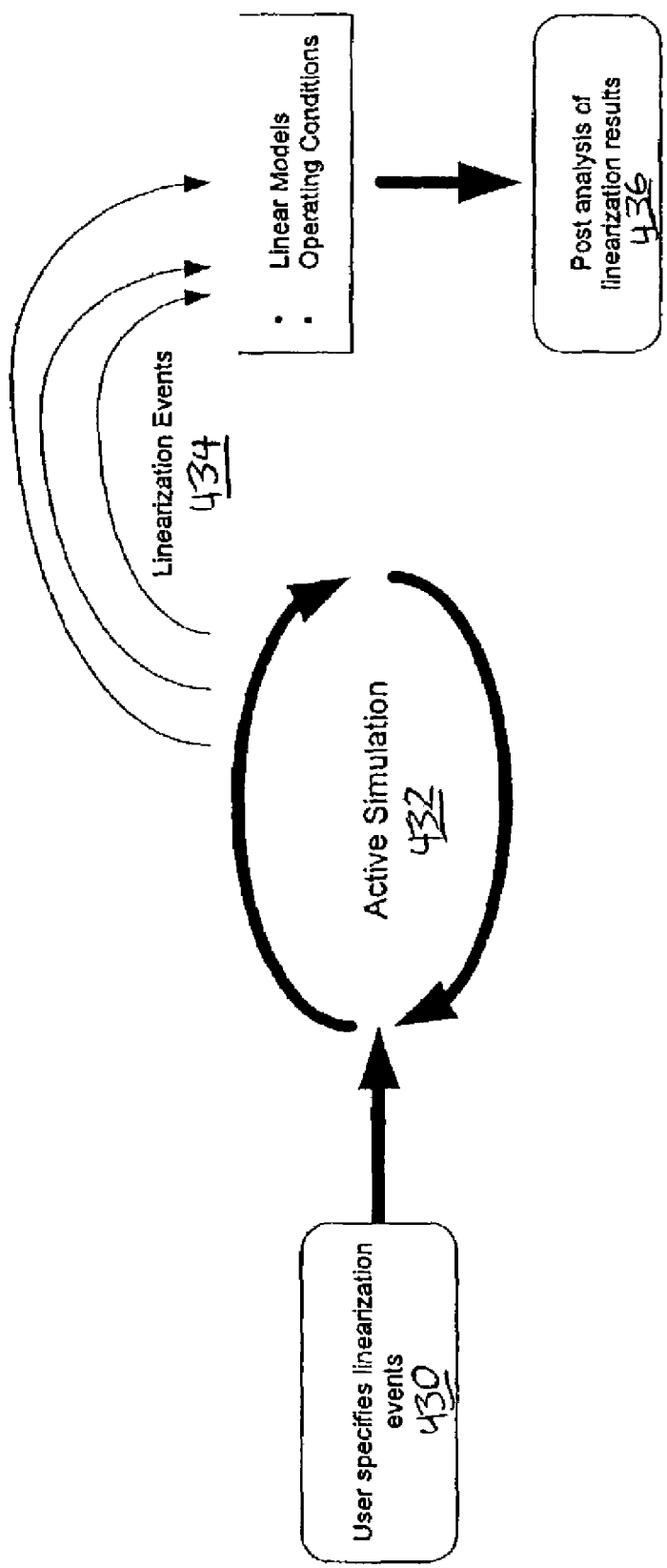
FIG. 15 is a diagrammatic illustration of a method of automated linearization analysis in accordance with one aspect of the present invention.

FIG. 15 is a diagrammatic illustration of the processing flow performed in the illustrative embodiment. In accordance with the method, the user specifies the specific times and/or events where the linearization analysis should occur as the model simulates the system (step 430). Alternatively, the system can be provided with some basic parameters that enable the system to determine the times and/or events where the linearization analysis should occur. The times and/or events can be specified, for example, using either a GUI or through a block added to the model. The times indicate points in elapsed time from a baseline starting point of the model simulation. The events indicate triggers or conditions that must be met, at which point the linearization analysis should occur. There can be multiple times and/or events specified in a model.

The user then initiates the simulation (step 432). Once the simulation is initiated, linearization analysis is automatically performed at the times and/or events specified by the user (step 434). At the completion of the simulation, the results of one or more linearization analyses are posted to the user (step 436). The posting can include forwarding the results to a command module, for example, or presenting a visual representation to the user through a GUI.

EXAMPLES

In an effort to clearly disclose and describe the operation of the present invention, the following examples demonstrate the method in operation. However, one of ordinary skill in the art will appreciate that the following description is merely illustrative of the method of the present invention, and by no means limits the invention to the examples or embodiments described herein.

An example system that can be modeled using the linearization analysis tool of the present invention can be found in an automobile. In automobiles, for example, control systems are used to monitor or regulate many processes. When a driver notes a posted speed limit that must be met, they make a visual measurement of speed by looking at the speedometer. If the car is moving too slowly, the driver pushes the accelerator down further and if the car is traveling too fast the accelerator is released. This is an example of feedback control since the speedometer provides feedback to the driver to control the speed of a car.

Figure 16:
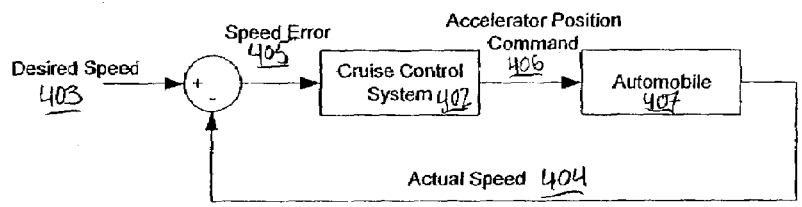
FIG. 16 is an example block diagram of a cruise control system in accordance with one aspect of the present invention.

FIG. 16 is a block diagram representation of a cruise control system 402 on an automobile 407. The goal of the system is to control the speed of a car driving down the road at a user defined Desired Speed 403. An Actual Speed 404 signal is called the feedback signal, and is used to compute a Speed Error 405, which is the difference between the Desired Speed 403 and the Actual Speed 404. The Cruise Control System 402 is designed to respond to the Speed Error 405 and compute an Accelerator Position Command 406 to change the speed of the car.

The model shows that the Desired Speed 403 and the Actual Speed 404 are compared to arrive at the Speed Error 405. The Speed Error 405 is then an input to the Cruise Control System 402, which has the ability to adjust the speed. The Cruise Control System 402 is in communication with the Accelerator Position Command 406 to set the position of the accelerator pedal, thus adjusting the speed of the automobile 407. The automobile 407 then provides output feedback, through the speedometer, in the form of the Actual Speed 404 for comparison, again, with the Desired Speed 403.

The design of a cruise control system requires that the behavior of the automobile be known. For a cruise control system it must be understood how the position of the accelerator pedal affects the speed of the car over time. Having an accurate understanding of the behavior of a physical system, like a car, allows a high performance control system to be designed. This behavior is typically captured in a physical model.

Figure 18:
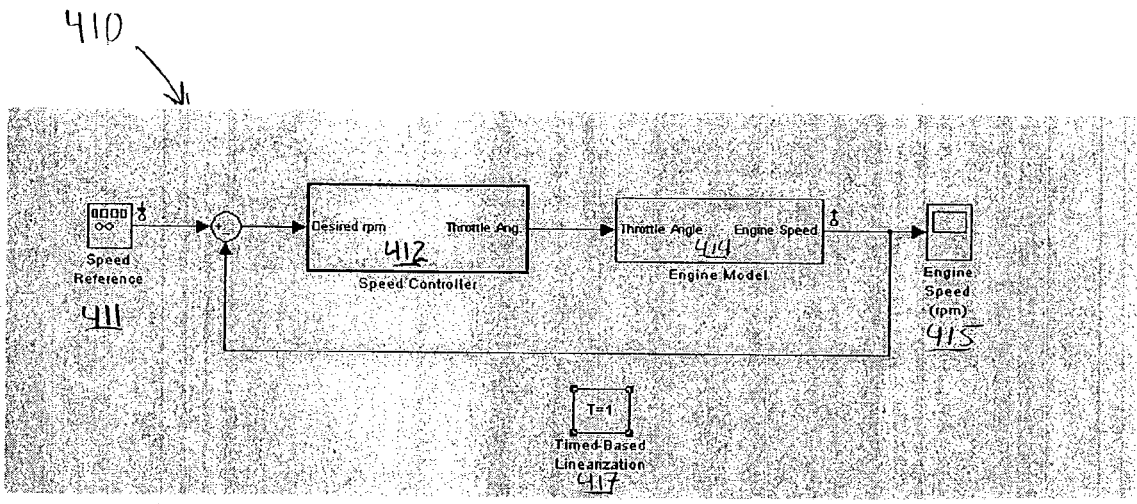
FIG. 18 is another example block diagram of the cruise control system of FIG. 16.

In order to create a model for the design of the cruise control system, the user first creates a model of the system as depicted in FIG. 18. An automobile model 410 is shown having a speed reference 411 entered by a driver (or simulation user). The speed reference 411 is communicated to a speed controller 412 that determines the desired rpm of the engine to achieve the speed of the speed reference 411 and thus, determines the angle of the throttle required. This information is communicated to an engine model 414, which takes the throttle angle and sets a corresponding engine speed 415 in rpm's. The linearization points are specified on the signals in the model. FIG. 17 shows the model with the linearization input marked on the signal 484 originating from the block entitled speed reference. The linearization output is marked on the signal 486 originating from the Engine Model block. Therefore, the linearization of the model will contain the effects of changes in the Engine Speed Reference on the Engine Speed.

Figure 19:
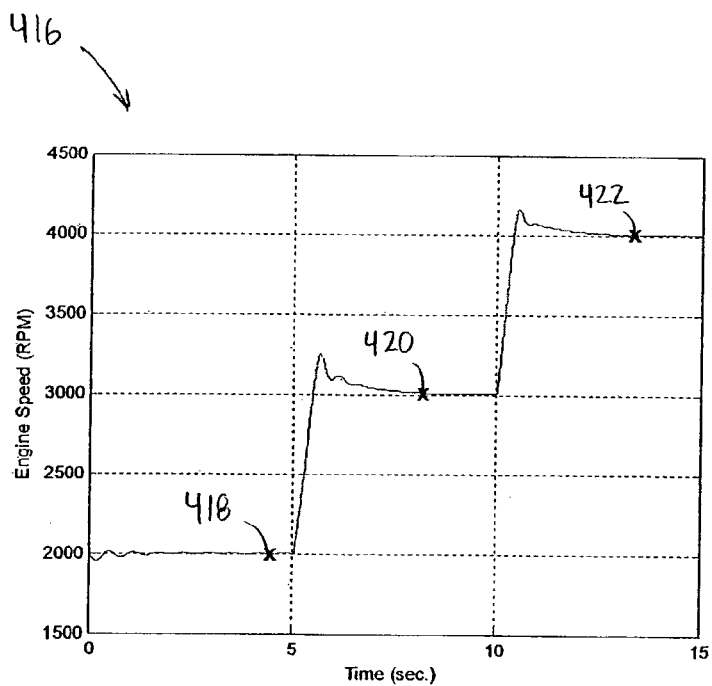
FIG. 19 is a plot of engine speed versus time in accordance with one aspect of the present invention.

To execute the automated linearization analysis of the present invention, the steps as previously described and shown in FIG. 15 are carried out by the user to achieve a linearization of an internal combustion engine model at different engine speeds. The automobile model 410, when initiated, results in a plot 416 of engine speed versus time as shown in FIG. 19. In this example simulation, the engine speed levels out at 2000 rpm, 3000 rpm, and 4000 rpm. Thus, the user can identify three instances when the system is in an equilibrium condition, a first instance 418 at about 3 seconds, a second instance 420 at about 7 seconds, and a third instance 422 at about 13 seconds. Once a Time Based Linearization Simulink® block 417 is placed in the automobile model 410, the user specifies linearization events (step 430) to occur at each of the equilibrium points of 3 seconds, 7 seconds, and 13 seconds. The user then activates the simulation (step 432). At 3 seconds, 7 seconds, and 13 seconds, the model automatically performs three different linearization analyses (step 434) and then posts the results of the linearization analyses to the user for review (step 436).

Figure 20:
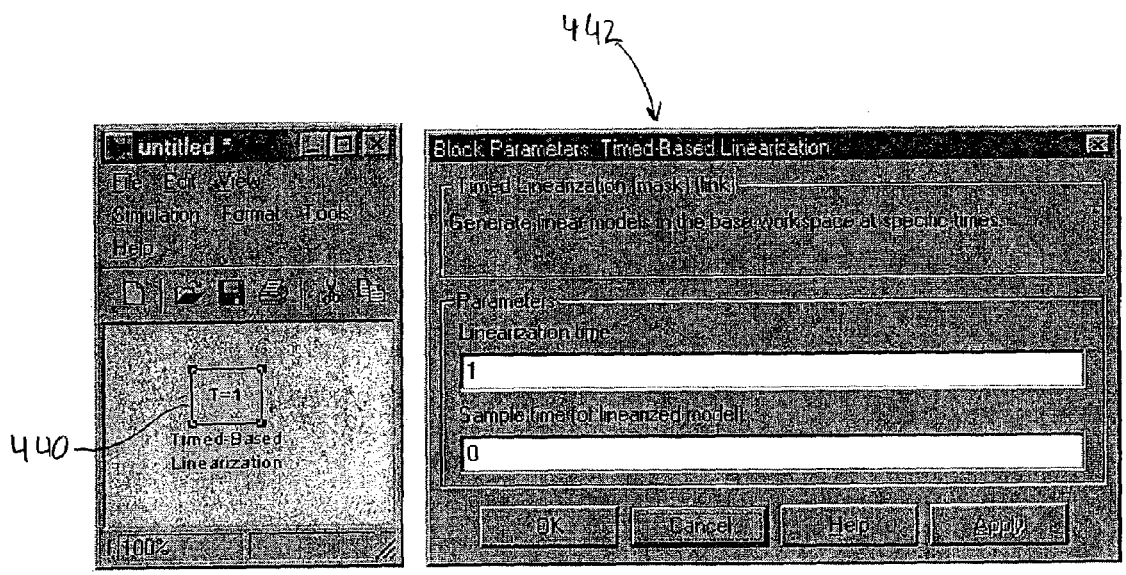
FIG. 20 is a screen depiction of a time-based linearization analysis GUI in accordance with one embodiment of the present invention.

FIG. 20 illustrates an example GUI for accessing and utilizing a time-based linearization block 440 as described above in the example of the cruise control system model. In the example block diagram modeling application Simulink®, the user can select the time-based linearization block 440 and insert it into a system model. The time-based linearization block 440 allows users to specify times at which a model should be linearized. Upon clicking or otherwise selecting the time-based linearization block 440, a block parameter GUI 442 pops up that allows users to enter the times for the linearization directly. The field sample time allows users to specify the sample rate of the linearized models.

Inside the time-based linearization block 440 there are three blocks, Constant, Sum, and Clock, which act to feed triggering events to a triggered linearization block (described below) when a user specified linearization time is met. These events fed to the triggered linearization block cause the linearization to be performed.

Figure 21:
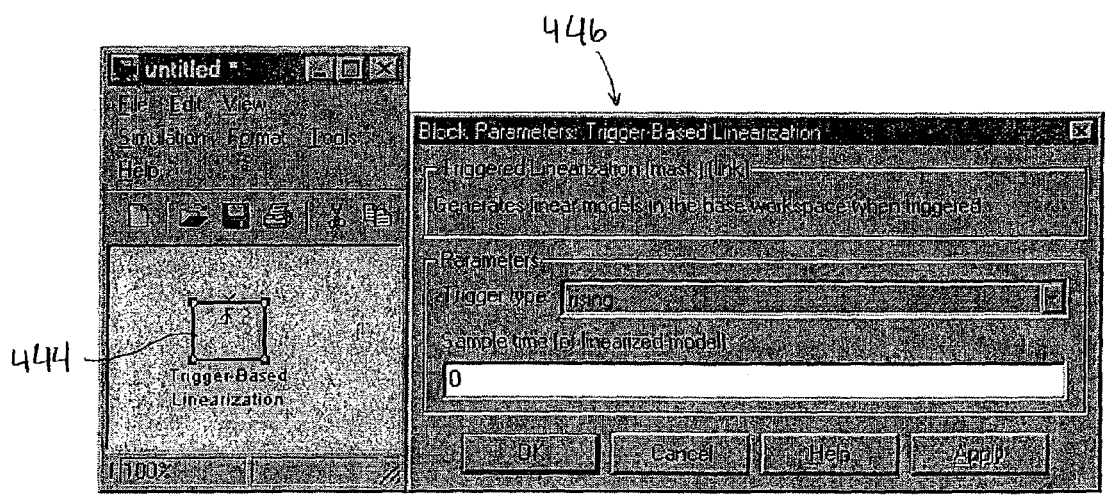
FIG. 21 is a screen depiction of a trigger-based linearization analysis GUI in accordance with one embodiment of the present invention.

FIG. 21 illustrates an example GUI for accessing and utilizing a trigger-based linearization block 444. A trigger, event, or condition, can also be the impetus for a linearization analysis to occur. The trigger-based linearization block 444 is a masked block, meaning that there are additional blocks within the main block. The trigger-based linearization block 444 allows users to specify events at which linearization analyses should occur. Upon selecting the trigger-based linearization block 444, a trigger block parameter GUI 446 pops up and allows users to specify different triggers, events, or conditions at which linearization analyses should occur. One of ordinary skill in the art will appreciate there can be a number of different types of triggers that can be specified. A rising trigger prompts execution of the linearization analysis when the input signal rises from a negative or zero value toward a positive value (or zero or positive if the initial value is negative). A falling trigger prompts execution of the linearization analysis when the input signal falls from a positive or a zero value toward a negative value (or greater negative if the initial value is negative). A third selection allows either trigger to apply, such that execution of the linearization analysis occurs when the input signal is either rising or falling. A function-call trigger prompts execution of the linearization analysis to be controlled by logic internal to an external S-function block. Inside the block mask there can be two additional blocks (not shown). The first is a trigger block that denotes that everything inside the block will be executed when the block is triggered by an external signal. An S-Function block represents a function that executes the linearization. This function can be opened at a command window by typing the command. As previously stated, one of ordinary skill in the art will appreciate that other triggers, events, or conditions can prompt the execution of a linearization analysis.

Figure 22:
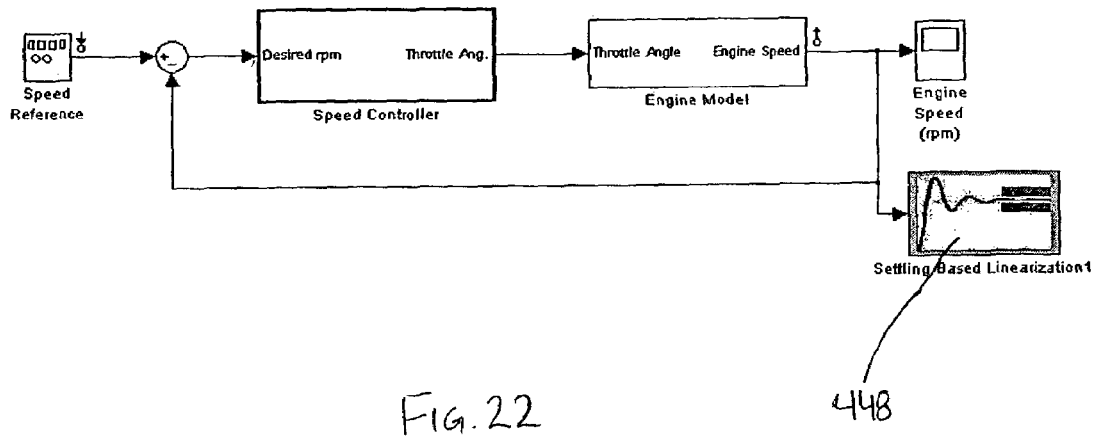
FIG. 22 is a block diagram of the example cruise control system with a settling based linearization analysis block in accordance with one embodiment of the present invention.

For example, an additional trigger-based linearization prompt can be a system settling based linearization block 448 as shown in FIG. 22. The system settling based linearization block 448 allows users to specify events where a signal inside a block diagram model settles near an operating condition. The system setting based linearization block 448 is shown inserted into the cruise control system model similar to the model 410 of FIG. 18.

Figure 23:
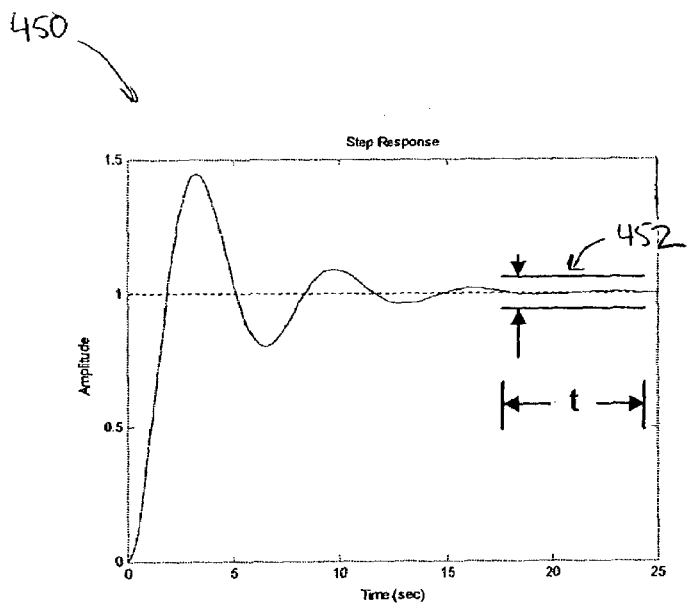
FIG. 23 is a plot of amplitude versus time of a system feedback signal in accordance with one aspect of the present invention.

The settling condition is defined when a signal during simulation stays between an interval region given by an upper and lower bound over a defined time period, t. FIG. 23 shows a plot 450 of step response amplitude versus time. The system receives an input that spikes the amplitude and then, through control algorithms, the system responds and eventually settles. The system settling based linearization block 448 can identify a settling region 452. When the system is operating within the parameters of the settling region 452, the system settling based linearization block 448 executes a linearization analysis, because the system is deemed to have met the settling criteria, which would have been defined to identify a substantially equilibrium system condition. As with other linearization blocks, the system settling based linearization block 448 has a GUI (not shown) to specify upper and lower bounds and the interval that the settling condition must be satisfied.

Figure 24:
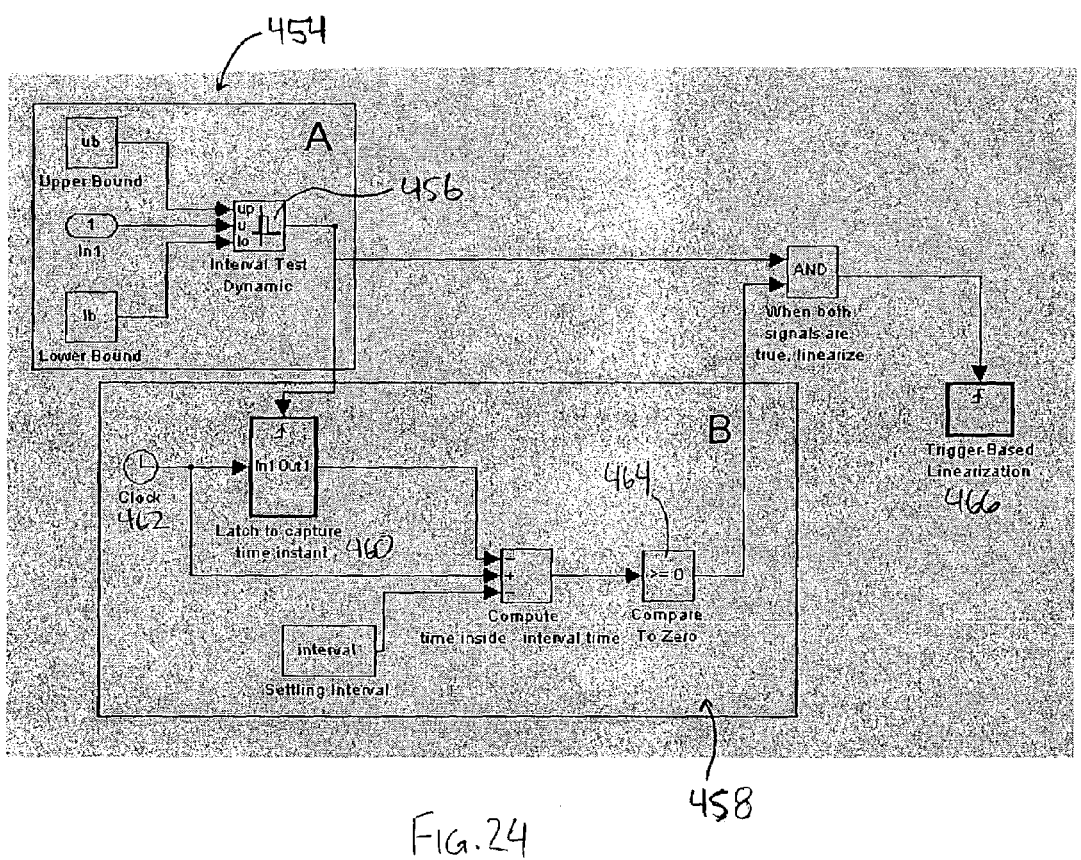
FIG. 24 is a diagrammatic illustration of the logic underlying the system settling based linearization analysis block in accordance with one aspect of the present invention.
Figure 25:
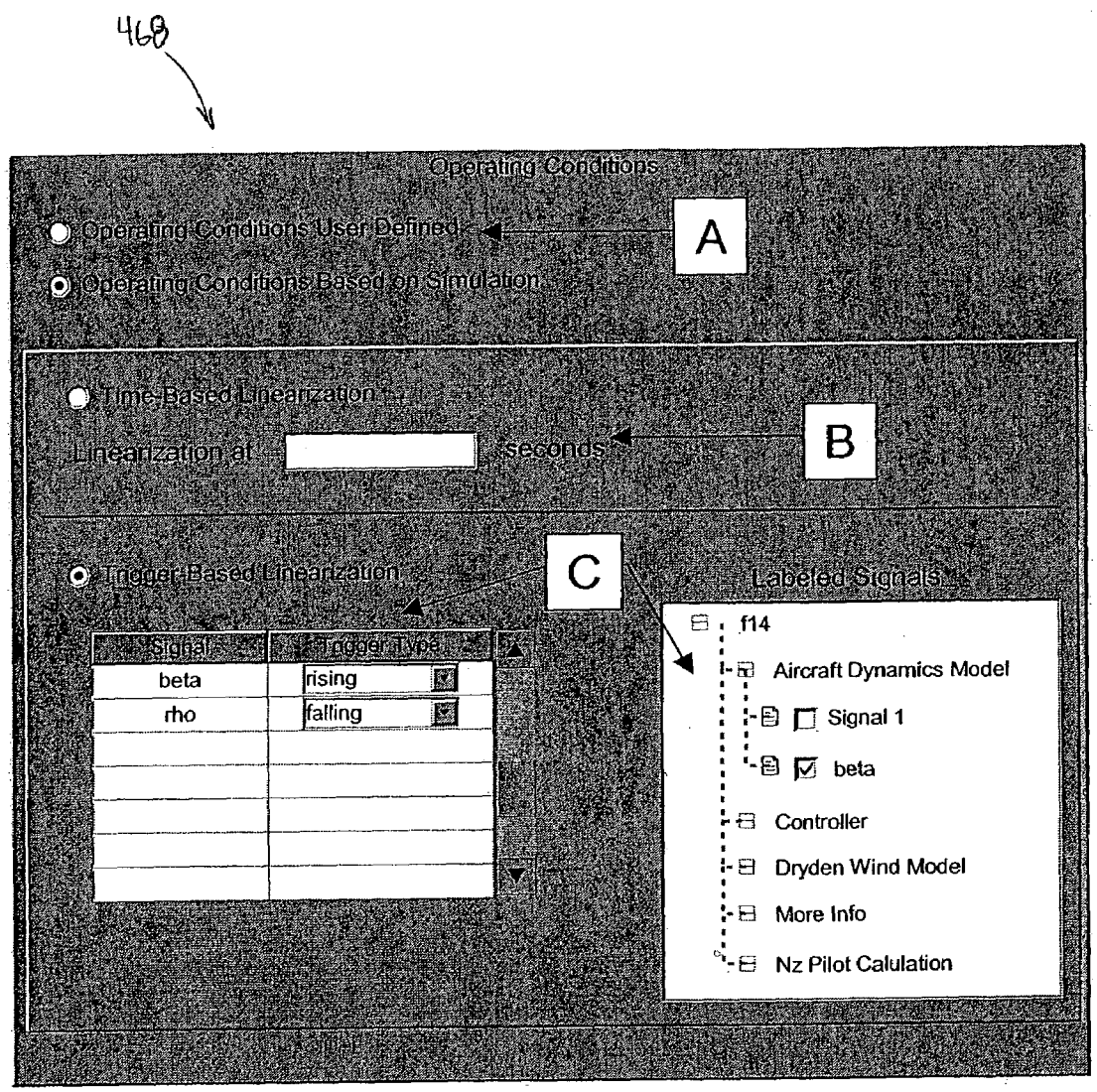
FIG. 25 is a screen depiction of a GUI for entering linearization analysis parameters in accordance with one embodiment of the present invention.

The logic inside the system settling based linearization block 448 computes trigger events for when the linearization should take place, and is illustrated in FIG. 24. There are two fundamental portions of the algorithm. A first portion 454 of the algorithm computes whether or not the input to the block is between upper and lower bounds defined by the user. When this condition is met, the output of an interval test dynamic block 456 changes from a value of zero to a value of one. At the event of when the interval test dynamic block 456 changes from zero to one, a rising edge trigger in a second portion 458 of the algorithm causes a latch block 460 to capture time from a clock 462 to get the time of the event. Then, the time of event is compared to the current time along with settling interval specified by the user. Once this comparison is greater than zero, the output of a compare to zero block 464 increases from zero to one. When the output of the computations in the first portion 454 and the second portion 458 are both true (each having a value of one), a trigger-based linearization block 466 will be executed to implement a linearization analysis.

There is no requirement that users define the time and trigger based events using a block. Alternatively, the user can access a menu option with a GUI 468 (see FIG. 25). The GUI 468 allows users to specify time and/or trigger-based linearizations of block diagram models without the need to add blocks to the models. In section A of the GUI 468, users can select between whether they would like to specify their model operating conditions directly or through simulation. Section B of the GUI 468 allows users to specify the time events at which linearization analyses should occur. This functionality is the same as the time-based linearization block 440 of FIG. 20. Section C of the GUI 468 allows users to select signals to linearize on trigger events. This functionality is the same as the trigger-based linearization block 444 of FIG. 21 and the system settling linearization block 448 of FIG. 22.

If a user chooses the option to pick user defined operating conditions, the GUI 468 uses a different process for linearization. The user is required in this case to enter in the operating condition or constraints individually. An operating condition constraint is a restriction on a state, model input, or model output that is embodied in the previously described trim analysis. An example constraint on a state would be that its state derivative is zero. Once the operating conditions or constraints on the operating conditions are specified, trim analysis is will be performed, then the model will be linearized. To completely specify the operating condition of a model the user must specify constraints on the states, the external inputs, and the internal signals.

In accordance with another example embodiment of the present invention, control system configurations can be developed during active simulation. The need for developing different control system configurations at various operating conditions is driven by the fact that systems behave differently at different operating conditions. The practice of generating control system configurations for multiple operating conditions is known as gain scheduling. For example, many flight control systems are designed to reconfigure based on operating condition variables such as altitude, airspeed, or Mach number. Likewise, in spark ignition engines, gain scheduling is used in engine emission control systems where the behavior of the Three-way-catalyst (TWC) changes dramatically on the temperature and loading of an engine. Other applications include the control of chemical processes where the behavior of the chemical process can very depending on variables such as reaction temperatures and concentration. For these and other applications not specifically mentioned, the controller configurations are typically designed individually at each operating condition. The present invention can be used to compute controller configurations in an automated manner during simulation.

Figure 26:
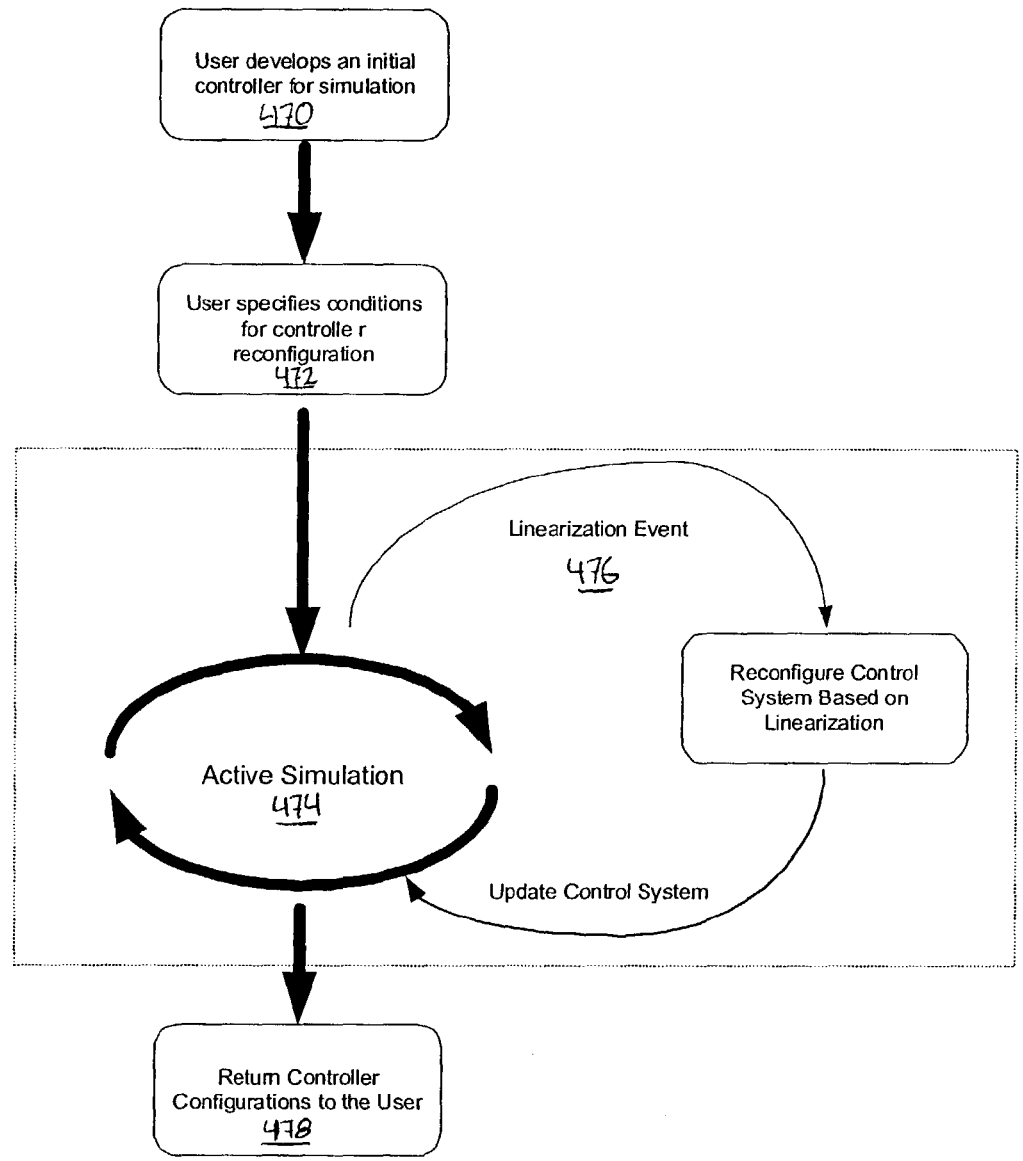
FIG. 26 is a flowchart of an example inventive process using the automated linearization analysis in accordance with one aspect of the present invention.

More specifically, FIG. 26 illustrates a stepwise representation of how a user can make use of the automated linearization analysis method of the present invention to generate controller configurations during simulation. The user begins by developing an initial block diagram model of a control system (controller) for simulation (step 470). Once the model is created, the user specifies linearization conditions or events for controller reconfiguration (step 472). As described herein, the linearization events can be based on time, triggers, system settling parameters, or other conditions as understood by one of ordinary skill in the art. Along with specifying the linearization events, the user can then specify the performance requirements for the controller configuration that are desired during the simulation. One of ordinary skill in the art will appreciate that there are a number of different conventional algorithms, known as controller synthesis methodologies, for computing controller configurations given a linearized model and performance requirements. The user can select the appropriate controller synthesis tool for a particular application. The performance requirements typically reflect the desired responsiveness of the control system and the overall robustness or stability of the control system. The user then initiates an active simulation (step 474) during which linearization events occur and linearization analyses are performed (step 476). The result of the linearization analysis can then be used to reconfigure the control system based on the performance requirements given by the user. The block diagram model of the control system can be then updated based on the results of the controller reconfiguration (step 478). The resulting controller configurations can be sent to a command module, GUI, or other interface.

Figure 27:
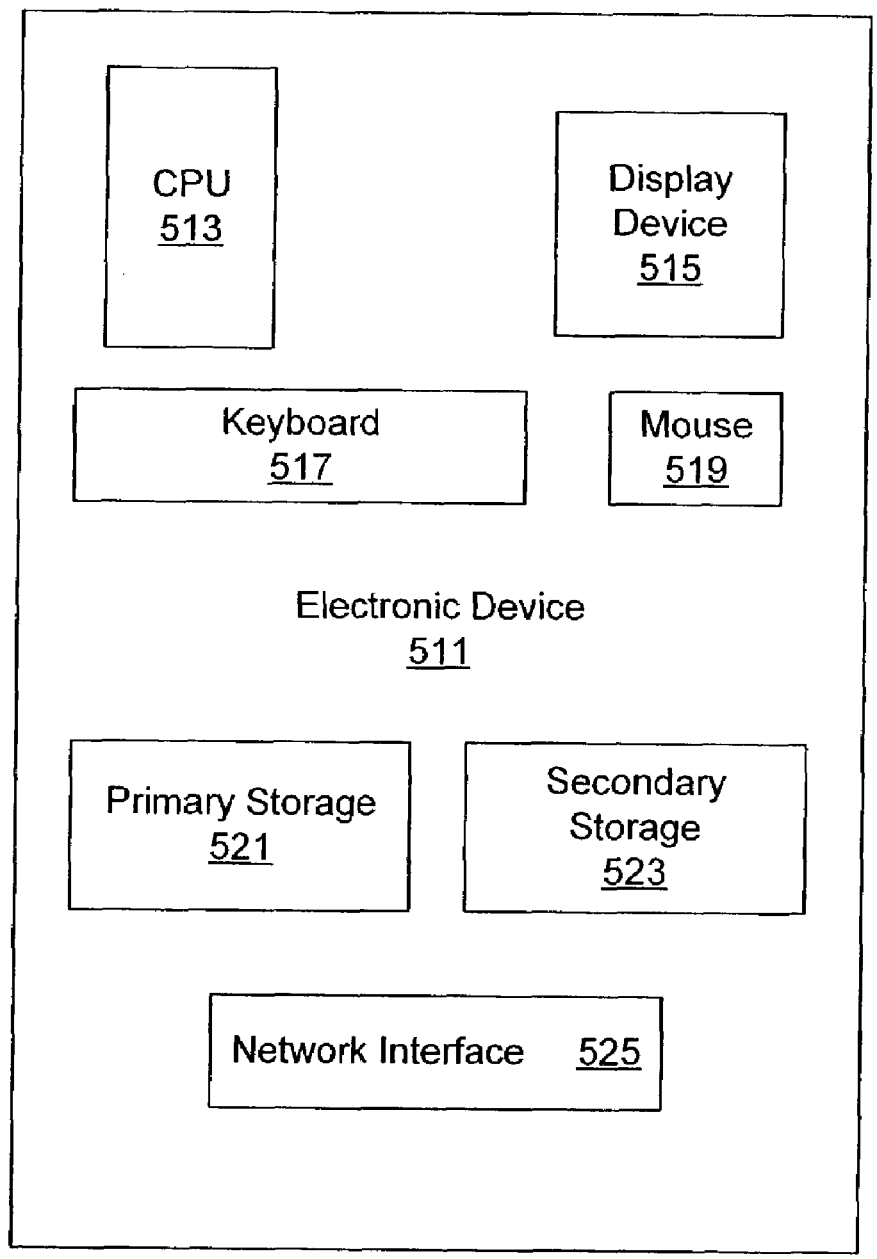
FIG. 27 is a diagrammatic illustration of an electronic device for implementing the method in accordance with the present invention.

As understood by one of ordinary skill in the art, the present invention can be implemented in an electronic device. FIG. 27 illustrates one example embodiment of an electronic device 511 suitable for practicing the illustrative embodiment of the present invention. The electronic device 511 is representative of a number of different technologies, such as personal computers (PCs), laptop computers, workstations, personal digital assistants (PDAs), Internet appliances, cellular telephones, and the like. In the illustrated embodiment, the electronic device 511 includes a central processing unit (CPU) 513 and a display device 515. The display device 515 enables the electronic device 511 to communicate directly with a user through a visual display. The electronic device 511 further includes a keyboard 517 and a mouse 519. Other potential input devices not depicted include a stylus, trackball, joystick, touch pad, touch screen, and the like. The electronic device 511 includes primary storage 521 and secondary storage 523 for storing data and instructions. The storage devices 521 and 523 can include such technologies as a floppy drive, hard drive, tape drive, optical drive, read only memory (ROM), random access memory (RAM), and the like. Applications such as browsers, JAVA virtual machines, and other utilities and applications can be resident on one or both of the storage devices 521 and 523. The electronic device 511 also includes a network interface 525 for communicating with one or more electronic devices external to the electronic device 511 depicted. A modem (not shown) is one form of establishing a connection with an external electronic device or network. The CPU 513 has either internally, or externally, attached thereto one or more of the aforementioned components.

In addition to the graphical operation utilization from the block diagram, the present invention can be utilized from external application program interfaces (APIs). For example, a user can configure and initiate a simulation utilizing the automated linearization functionality from an external interface. To implement such a simulation, the user enters the conditions for the linearization to be performed on a web form page, and submits the form. When the form is submitted, the simulation initiates and at each linearization, results are returned to the user, for example by display on a web page.

The present invention serves to automate the selection of the operating conditions for linearization analyses through the use of simulation. One or more linearizations occur at user specified times, events, or conditions. The parameters for linearization can be entered by the user either in a block diagram format or in a GUI format. Thus, the present invention enables users of block diagram models of dynamic systems, such as Simulink®, to utilize simulation to define operating conditions for linearization. Users can generate operating conditions during simulation instead of explicitly specifying them by hand or using trim analysis. Thus, the design and refinement process is greatly enhanced.

Numerous modifications and alternative embodiments of the present invention will be apparent to those skilled in the art in view of the foregoing description. Accordingly, this description is to be construed as illustrative only and is for the purpose of teaching those skilled in the art the best mode for carrying out the present invention. Details of the structure and method may vary substantially without departing from the spirit of the invention, and exclusive use of all modifications that come within the scope of the appended claims is reserved. It is intended that the present invention be limited only to the extent required by the appended claims and the applicable rules of law.

What is claimed is:

1. In an electronic device, a method of generating a linear time-invariant model, comprising:
    providing a system model having a plurality of operating points;
    in response to a user input, specifying at least one event at which a linearization analysis of the system model is performed;
    starting a simulation of the system model;
    automatically determining one or more equilibrium operating conditions for the linearization analysis of the system model as the simulation of the system model is running;
    detecting an occurrence of the at least one event as the simulation of the system model is running;
    automatically performing the linearization analysis of the system model based on the detecting, the linearization analysis being performed using the determined one or more equilibrium operating conditions; and
    generating the linear time-invariant model based on output results of the linearization analysis of the system model, wherein the generated linear time-invariant model is saved in a storage device.

2. The method of claim 1, wherein the system model is represented by a block diagram.

3. The method of claim 2, further comprising inserting a linearization block into the block diagram.

4. The method of claim 3, further comprising connecting the linearization block with the block diagram.

5. The method of claim 1, wherein the system model is represented by a block diagram simulation of a dynamic system.

6. The method of claim 5, wherein the dynamic system is defined by at least one of a discrete, continuous, and hybrid equation.

7. The method of claim 1, wherein the system model represents a control system.

8. The method of claim 1, wherein the at least one event comprises a time based event.

9. The method of claim 1, wherein the at least one event comprises a condition based event.

10. The method of claim 9, wherein the condition comprises at least one of a rising condition wherein a measured value increases, a falling condition wherein a measured value decreases, and a function call condition wherein an indication of a call being made to a function occurs.

11. The method of claim 9, wherein the condition comprises the system model settling within specified parameters, at which point the linearization analysis is executed.

12. The method of claim 1, wherein a plurality of events at which a linearization analysis should be performed are specified so that the linearization analysis is performed multiple times.

13. The method of claim 1, wherein prior to specifying the at least one event, running the simulation of the system model to acquire an indication of likely equilibrium points upon which the at least one event can be specified.

14. The method of claim 1, further comprising providing a block diagram function for launching a linearization analysis tool.

15. The method of claim 14, wherein prior to specifying the at least one event, the user launching the linearization analysis tool.

16. The method of claim 1, further comprising providing a command module for receiving and manipulating information to which the output results are forwarded.

17. The method of claim 1, further comprising providing a graphical user interface to which the output results are forwarded for representation to a user.

18. A computer program product embodied on a computer-readable medium and comprising code that, when executed, causes a computer to perform the following:
    providing a system model having a plurality of operating points;
    in response to a user input, specifying at least one event at which a linearization analysis of the system model is performed;
    starting a simulation of the system model;
    automatically determining one or more equilibrium operating conditions for the linearization analysis of the system model as the simulation of the system model is running;
    detecting an occurrence of the at least one event as the simulation of the system model is running;
    automatically performing the linearization analysis of the system model based on the detecting, the linearization analysis being performed using the determined one or more equilibrium operating conditions; and
    generating the linear time-invariant model based on output results of the linearization analysis of the system model, wherein the generated linear time-invariant model is saved in a storage device.

19. The computer program product of claim 18, wherein the system model is represented by a block diagram.

20. The computer program product of claim 19, further comprising inserting a linearization block into the block diagram.

21. The computer program product of claim 20, further comprising connecting the linearization block with the block diagram.

22. The computer program product of claim 18, wherein the system model is represented by a block diagram simulation of a dynamic system.

23. The computer program product of claim 22, wherein the dynamic system is defined by at least one of a discrete, continuous, and hybrid equation.

24. The computer program product of claim 18, wherein the system model represents a control system.

25. The computer program product of claim 18, wherein the at least one event comprises a time based event.

26. The computer program product of claim 18, wherein the at least one event comprises a condition based event.

27. The computer program product of claim 26, wherein the condition comprises at least one of a rising condition wherein a measured value increases, a falling condition wherein a measured value decreases, and a function call condition wherein an indication of a call being made to a function occurs.

28. The computer program product of claim 26, wherein the condition comprises the system model settling within specified parameters, at which point the linearization analysis is executed.

29. The computer program product of claim 18, wherein a plurality of events at which a linearization analysis should be performed are specified so that the linearization analysis is performed multiple times.

30. The computer program product of claim 18, wherein prior to specifying the at least one event, running the simulation of the system model to acquire an indication of likely equilibrium points upon which the at least one event can be specified.

31. The computer program product of claim 18, further comprising providing a block diagram function for launching a linearization analysis tool.

32. The computer program product of claim 31, wherein prior to specifying the at least one event, the user launching the linearization analysis tool.

33. The computer program product of claim 18, further comprising providing a command module for receiving and manipulating information to which the output results are forwarded.

34. The computer program product of claim 18, further comprising providing a graphical user interface to which the output results are forwarded for representation to a user.

35. A system for generating a linear time-invariant model based on a system model having a plurality of operating points, comprising:
    a processor for executing:
        an event mechanism for storing at least one event at which a linearization analysis of the system model is performed;
        an execution engine for simulating the system model, a simulation of the system model automatically determining one or more equilibrium operating conditions for the linearization analysis of the system model;
        a linearization analysis function for detecting an occurrence of the at least one event during the simulation of the system model, and for automatically performing the linearization analysis of the system model upon detecting the occurrence of the at least one event as the simulation of the system model is running, the linearization analysis being performed using the determined one or more equilibrium operating conditions;
        an output mechanism for generating the linear time-invariant model based on output results of the linearization analysis of the system model; and
    a storage device for saving the generated linear time-invariant model.

36. The system of claim 35, wherein the system model is represented by a block diagram.

37. The system of claim 36, wherein the linearization analysis function comprises a linearization block inserted into the block diagram.

38. The system of claim 37, wherein the linearization block is connected with the block diagram.

39. The system of claim 35, wherein the system model is represented by a block diagram simulation of a dynamic system.

40. The method of claim 39, wherein the dynamic system is defined by at least one of a discrete, continuous, and hybrid equation.

41. The system of claim 35, wherein the system model represents a control system.

42. The system of claim 35, wherein the at least one event comprises a time based event.

43. The system of claim 35, wherein the at least one event comprises a condition based event.

44. The system of claim 43, wherein the condition comprises at least one of a rising condition wherein a measured value increases, a falling condition wherein a measured value decreases, and a function call condition wherein an indication of a call being made to a function occurs.

45. The system of claim 43, wherein the condition comprises the system model settling within specified parameters, at which point the linearization analysis is executed.

46. The system of claim 35, wherein a plurality of events at which a linearization analysis should be performed are specified so that the linearization analysis is performed multiple times.

47. The system of claim 35, wherein the simulation of the system model is run to acquire an indication of likely equilibrium points upon which the at least one event can be specified.

48. The system of claim 35, further comprising a block diagram function for launching a linearization analysis tool.

49. The system of claim 48, wherein prior to specifying the at least one event, the user launching the linearization analysis tool.

50. The system of claim 35, further comprising a command module for receiving and manipulating information to which the output results are forwarded.

51. The system of claim 35, further comprising a graphical user interface to which the output results are forwarded for representation to a user.

52. In an electronic device, a method of generating a linear time-invariant model, comprising:
providing a system model having a plurality of operating points;
in response to a user input, specifying at least one time based event and at least one non-temporal condition based event at which a linearization analysis of the system model is performed;
starting a simulation of the system model;
automatically determining one or more equilibrium operating conditions for the linearization analysis of the system model as the simulation of the system model is running;
detecting an occurrence of the at least one time based event and at least one non-temporal condition based event as the simulation of the system model is running;
automatically performing the linearization analysis of the system model based on the detecting, the linearization analysis being performed using the determined one or more equilibrium operating conditions; and
generating the linear time-invariant model based on output results of the linearization analysis of the system model, wherein the generated linear time-invariant model is saved in a storage device.

53. The method of claim 52, wherein the system model is represented by a block diagram.

54. The method of claim 53, further comprising inserting a linearization block into the block diagram.

55. The method of claim 54, further comprising connecting the linearization block with the block diagram.

56. The method of claim 52, wherein the system model is represented by a block diagram simulation of a dynamic system.

57. The method of claim 56, wherein the dynamic system is defined by at least one of a discrete, continuous, and hybrid equation.

58. The method of claim 52, wherein the system model represents a control system.

59. The method of claim 52, wherein the condition comprises at least one of a rising condition wherein a measured value increases, a falling condition wherein a measured value decreases, and a function call condition wherein an indication of a call being made to a function occurs.

60. The method of claim 52, wherein the condition comprises the system model settling within specified parameters, at which point the linearization analysis is executed.

61. The method of claim 52, wherein a plurality of events at which a linearization analysis should be performed are specified so that the linearization analysis is performed multiple times.

62. The method of claim 52, wherein prior to specifying the at least one event, running the simulation of the system model to acquire an indication of likely equilibrium points upon which the at least one event can be specified.

63. The method of claim 52, further comprising providing a block diagram function for launching a linearization analysis tool.

64. The method of claim 63, wherein prior to specifying the at least one event, the user selecting the block diagram function to launch the linearization analysis tool.

65. The method of claim 52, further comprising providing a command module for receiving and manipulating information to which the output results are forwarded.

66. The method of claim 52, further comprising providing a graphical user interface to which the output results are forwarded for representation to a user.

67. In an electronic device, a method of generating a linear time-invariant model, comprising:
developing a block diagram model of a system for simulation, the model having a plurality of operating points;
in response to a user input, specifying linearization conditions for reconfiguration of the system;
starting the simulation of the block diagram model;
automatically determining one or more equilibrium operating conditions for a linearization analysis of the system model as the simulation of the system model is running;
detecting an occurrence of at least one linearization event occurring as the simulation of the block diagram model is running;
automatically performing at least one linearization analysis of the system model based on the detecting, the at least one linearization analysis being performed using the determined one or more equilibrium operating conditions;
the electronic device outputting a result of the at least one linearization analysis of the system model;
reconfiguring the system based on the result to meet performance requirements provided by the user; and
updating the block diagram model of the system to comply with the system after reconfiguring to derive the linear time-invariant model,
wherein the derived linear time-invariant model is saved in a storage device.

68. In an electronic device, a method of generating a linear time-invariant model, comprising:
providing a system model having a plurality of operating points;

specifying at least one event at which the system model is linearized;

executing the system model;

automatically determining one or more equilibrium operating conditions for linearizing the system model as the execution of the system model is running;

detecting an occurrence of the at least one event as the execution of the system model is running;

automatically linearizing the system model when the occurrence of the at least one event is detected as the execution of the system model is running, the system model being linearized using the determined one or more equilibrium operating conditions;

generating the linear time-invariant model based on the linearizing of the system model; and storing the generated linear time-invariant model in a storage device.

69. In an electronic device, a method of generating a linear time-invariant model, comprising:

providing a system model having a plurality of operating points;

specifying a first event and a second event at which the system model is linearized;

executing the system model;

automatically generating one or more equilibrium operating conditions for linearizing the system model as the execution of the system model is running;

detecting occurrences of the first event and the second event as the execution of the system model is running;

automatically linearizing the system model based on the detecting, the system model being linearized using the one or more determined equilibrium operating conditions;

generating the linear time-invariant model based on the linearizing of the system model;

storing the generated linear time-invariant model in a storage device.

70. In an electronic device, a method of generating a linear time-invariant model, comprising:

providing a system model having a plurality of operating points, the system including a first portion and a second portion;

specifying a first event and a second event at which the system model is linearized;

executing the system model;

automatically determining one or more equilibrium operating conditions for linearizing the system model as the execution of the system model is running;

detecting occurrences of the first event and the second event as the execution of the system model is running;

automatically linearizing the first portion and the second portion of the system model based on the detecting, the first portion and the second portion of the system model being linearized using the one or more determined equilibrium operating conditions; and generating the linear time-invariant model based on the linearizing of the system model, storing the generated linear time-invariant model in a storage device.

\* \* \* \* \*

UNITED STATES PATENT AND TRADEMARK OFFICE
CERTIFICATE OF CORRECTION

PATENT NO. : 7,680,637 B1
APPLICATION NO. : 10/414645
DATED : March 16, 2010
INVENTOR(S) : Greg Wolodkin It is certified that error appears in the above-identified patent and that said Letters Patent is hereby corrected as shown below:

At column 18, line 38 (Specification) of the printed patent, please insert -- . -- after process.

Signed and Sealed this

Sixth Day of July, 2010

David J. Kappos
*Director of the United States Patent and Trademark Office*